(12) United States Patent
McDermott

(10) Patent No.: US 7,658,071 B1
(45) Date of Patent: Feb. 9, 2010

(54) SOLFIRE SOLAR CONCENTRATOR AND POINTER STRUCTURE

(76) Inventor: Patrick P. McDermott, 2411 Rocky Branch Rd., Vienna, VA (US) 22181

( * ) Notice: Subject to any disclaimer, the term of this patent is extended or adjusted under 35 U.S.C. 154(b) by 384 days.

(21) Appl. No.: 11/637,962

(22) Filed: Dec. 12, 2006

Related U.S. Application Data

(60) Provisional application No. 60/749,050, filed on Dec. 12, 2005.

(51) Int. Cl.
*B60K 16/00* (2006.01)
*F24J 2/36* (2006.01)

(52) U.S. Cl. ............ 60/641.8; 126/624; 126/627; 126/697

(58) Field of Classification Search .......... 60/641.8; 126/624–627, 690, 694, 697
See application file for complete search history.

(56) References Cited

U.S. PATENT DOCUMENTS

| | | | |
|---|---|---|---|
| 4,153,039 A | 5/1979 | Carroll | |
| 4,172,739 A | 10/1979 | Tassen | |
| 4,210,121 A * | 7/1980 | Stark | 126/573 |
| 4,252,107 A | 2/1981 | Horton | |
| 4,289,118 A | 9/1981 | Stark | |
| 4,300,533 A * | 11/1981 | Sacco | 126/601 |
| 4,301,321 A | 11/1981 | Bartels | |
| 4,355,630 A | 10/1982 | Fattor | |
| 4,359,041 A | 11/1982 | Snodgrass | |
| 4,365,618 A | 12/1982 | Jones | |
| 4,457,297 A | 7/1984 | Sobczak et al. | |
| 4,458,670 A * | 7/1984 | Lhenry | 126/601 |
| 4,463,749 A | 8/1984 | Sobczak et al. | |
| 4,476,853 A | 10/1984 | Arbogast | |
| 4,491,388 A | 1/1985 | Wood | |
| 4,535,961 A | 8/1985 | Sobczak et al. | |
| 4,552,126 A * | 11/1985 | Boyd | 126/680 |
| 4,566,432 A | 1/1986 | Sobczak et al. | |
| 4,628,142 A | 12/1986 | Hashizume | |
| 4,832,001 A | 5/1989 | Baer | |
| 4,870,949 A | 10/1989 | Butler | |
| 4,968,355 A * | 11/1990 | Johnson | 136/246 |
| 5,114,101 A * | 5/1992 | Stern et al. | 244/172.8 |
| 5,398,519 A | 3/1995 | Weber et al. | |
| 5,498,297 A | 3/1996 | O'Neill et al. | |
| 6,020,554 A * | 2/2000 | Kaminar et al. | 136/246 |
| 6,031,179 A | 2/2000 | O'Neill | |
| 6,302,099 B1 | 10/2001 | McDermott | |
| 6,668,820 B2 | 12/2003 | Cohen et al. | |
| 6,704,607 B2 | 3/2004 | Stone et al. | |
| 6,717,045 B2 | 4/2004 | Chen | |

* cited by examiner

*Primary Examiner*—Hoang M Nguyen
(74) *Attorney, Agent, or Firm*—James Creighton Wray; Meera P. Narasimhan

(57) ABSTRACT

Solar generators have Fresnel lenses and spaced heat absorbers or photovoltaic cells for receiving focused solar rays. Heat is removed from their backs by boiling liquid in conical receivers. Pins or fins extend rearward into the receivers from the heat absorbers or photovoltaic cells. Liquid supply to the receivers is controlled by valves and floats or sensors. Tubes remove steam or vapor from the receivers for driving generators or for cooling photovoltaic cells. Hinged tubes which form the foldable support conduct the steam to generators and condense the vapor. Liquid is returned to a holding tank, is pumped to a distribution tank and is conducted by some of the structural tubes back to the valved receivers.

21 Claims, 21 Drawing Sheets

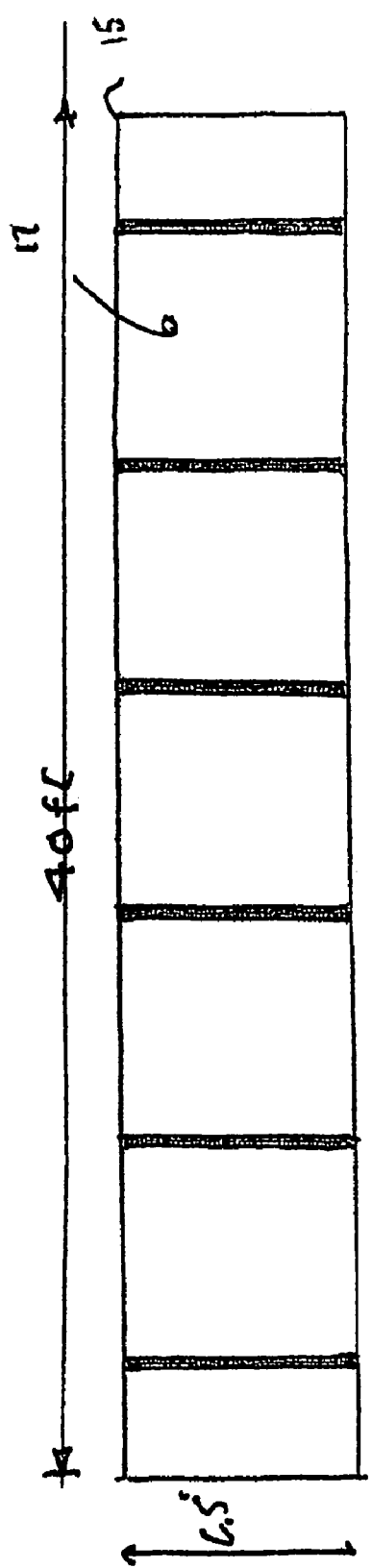
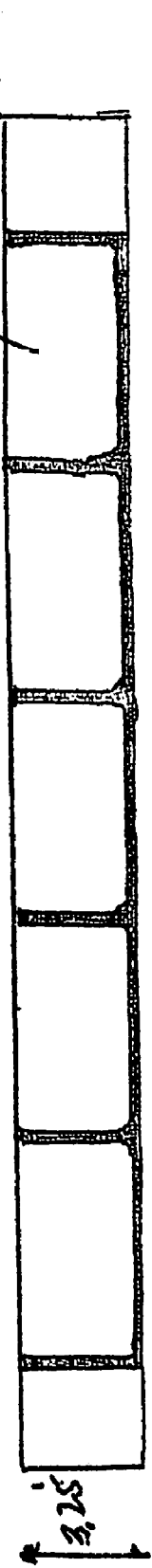
FIG 2d
FIG 2e

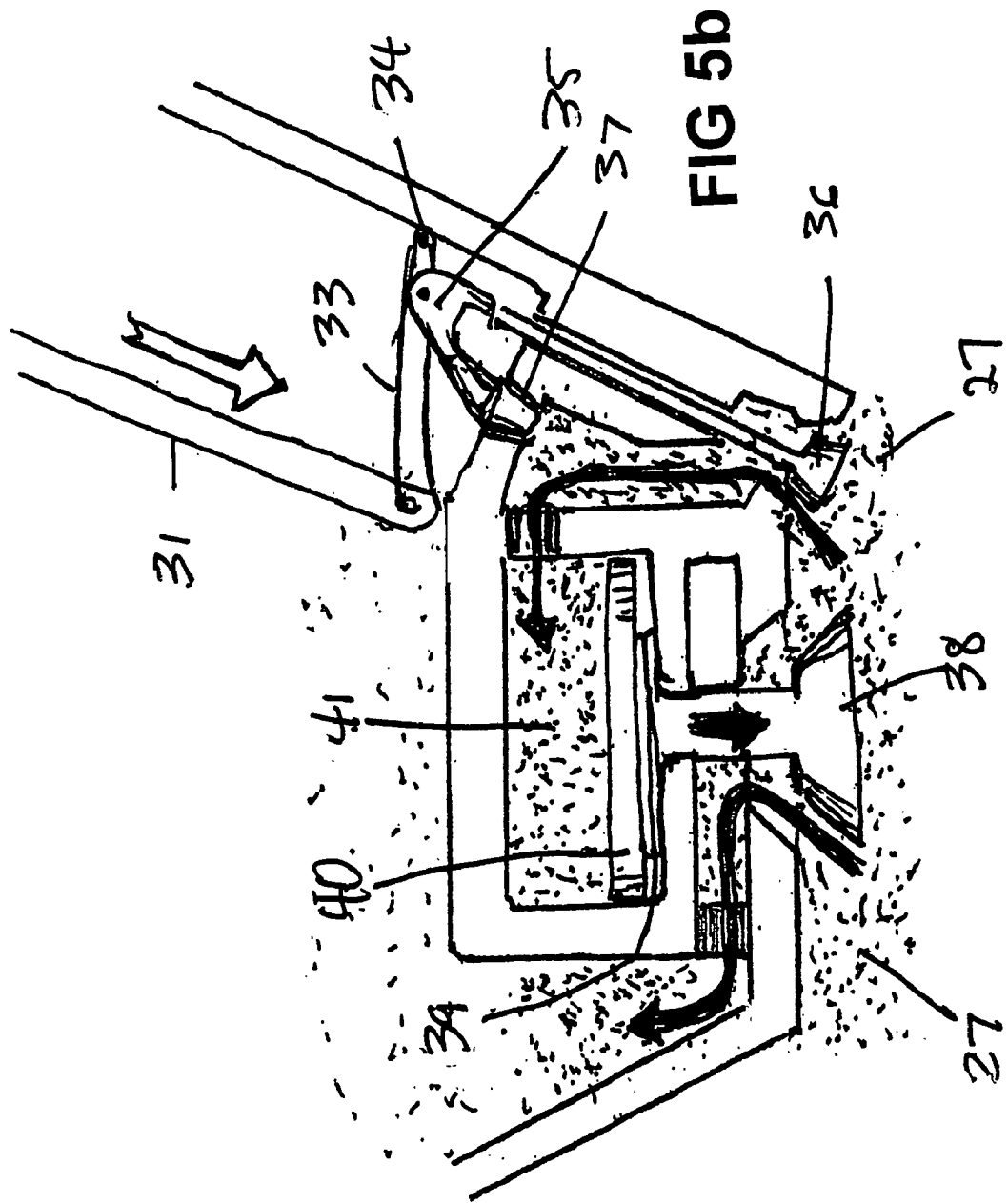

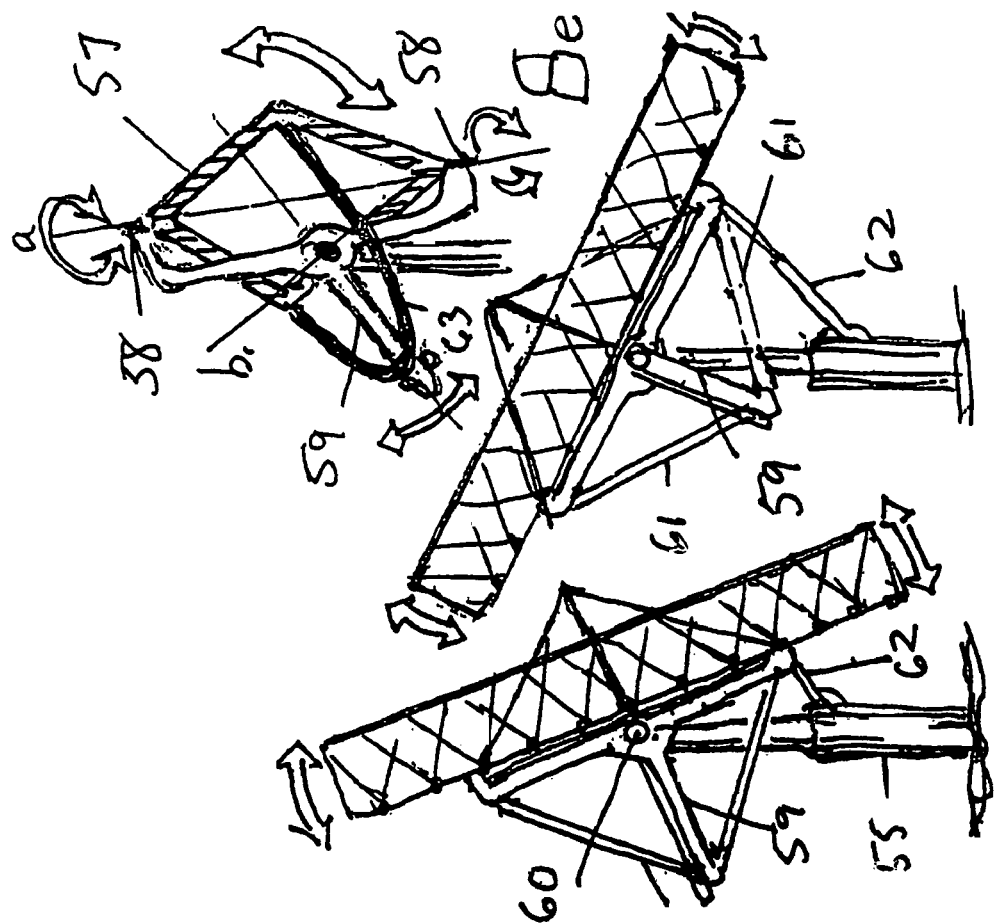
FIG 8e
FIG 8d
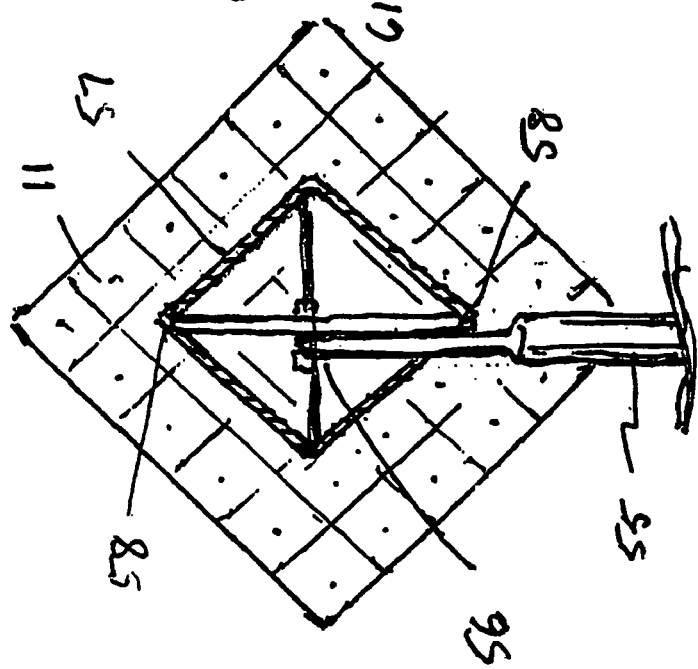
FIG 8c

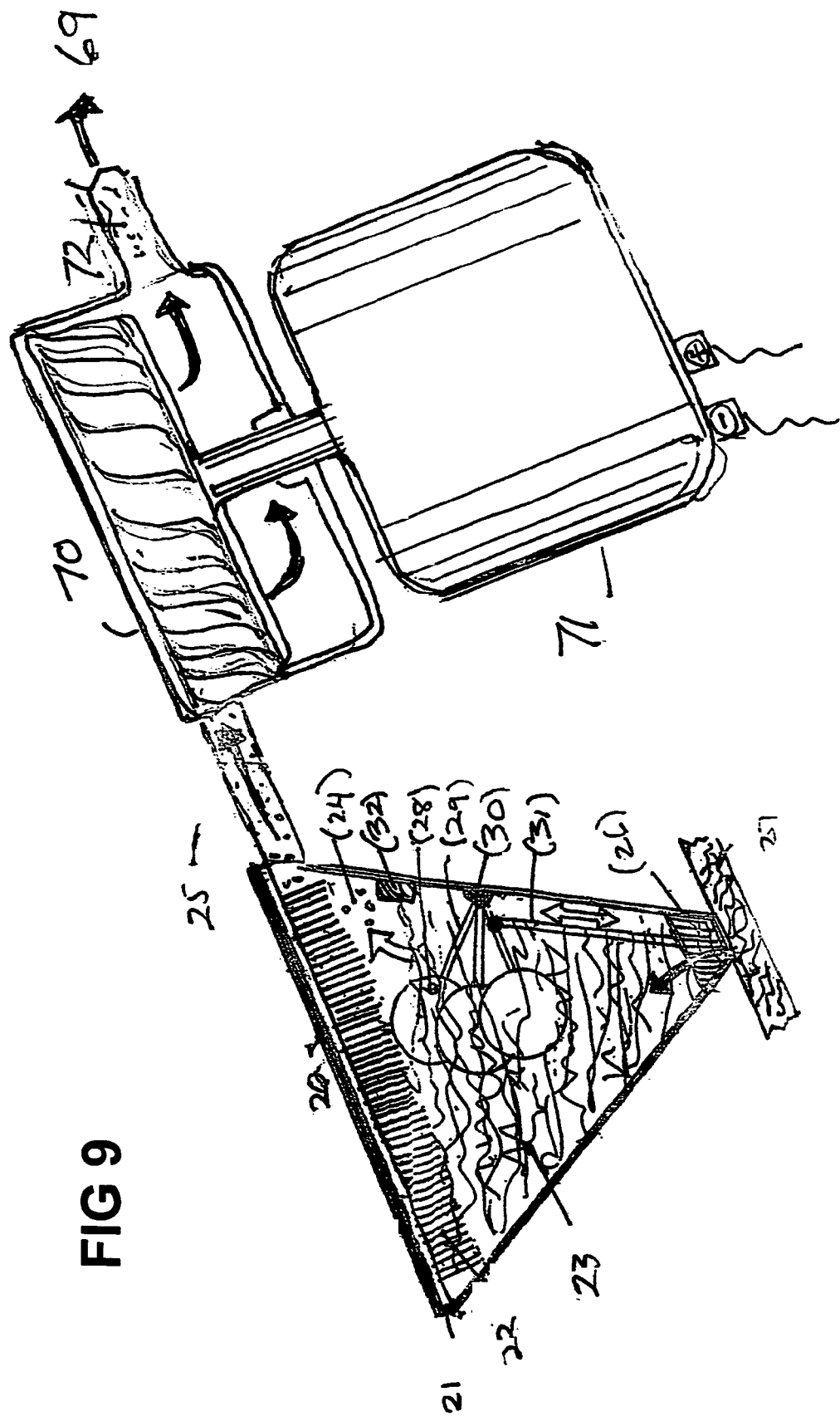

SOLFIRE SOLAR CONCENTRATOR AND POINTER STRUCTURE

This application claims the benefit of U.S. Provisional Application No. 60/749,050 filed Dec. 12, 2005, which is hereby incorporated by reference in its entirety.

BACKGROUND OF THE INVENTION

In several previous terrestrial systems, very high levels of solar concentration (hundreds of suns) have been achieved with reflective optics to generate steam for powering turbines and direct conversion of heat to electricity via Sterling engines or photovoltaic (PV) cell for direct electrical conversion. Refractive optics in many forms, mainly Fresnel lenses, has been used for moderate levels of concentration (e.g., 20 suns) using flat or curved lenses to focus on a linear PV receiver. Flat or domed Fresnel lenses can achieve hundreds of suns of concentration using spot PV receivers.

MIDWAY Corporation, Chicago, Ill., for example, marketed a flat aperture configuration, with multiple Fresnel lenses concentrating light on small PV cells (1-2 cm$^2$) distributed on the back plane of the structure with a focal length less than a foot. The heat was dissipated in the sheet metal back plane, and was adequate as long as the small receivers were adequately spread apart.

ENTECH Corporation, Keller, Tex., has developed both trough (curve lens) line concentrators and domed lenses for spot concentrators, and has flown a domed Fresnel lens in space using dual-junction cells. In the case of the line array, the terrestrial system uses passive cooling (aluminum back plane with extruded aluminum fins) for 20× concentration. In space application, ENTECH uses high thermal conductivity graphite for heat spreading for both domed and trough concentrators. In each case, however, the size of the PV receiver is relatively small, with a short focal length lens.

As long as the lenses and receivers are small, the thermal management problem can be solved through passive cooling techniques. But, if the size of the system (larger lenses, receivers, and focal lengths) is increased to achieve "economies of scale," the thermal management of waste heat (that not converted to electrical energy by the PV conversion) becomes technically challenging.

Traditionally, the cooling of high power electronics requires active cooling to remove kilowatts of heat. This often entails pumping of water or other working fluids through cold plates, or in the extreme, the use of refrigeration units to chill the working fluid. In traditional two-phase systems, the use of compressors and heat exchangers is required to remove the heat. These often entail large investment of equipment, require additional kilowatt of electrical energy to operate refrigeration equipment, all of which adds considerably to the cost, and weighs against "scaling up" the high concentration (hundreds of suns) PV systems.

Needs continue to exist for improved solar power methods and apparatus, and for assembly methods that allow rapid deployment of arrays of any kind.

SUMMARY OF THE INVENTION

The method and apparatus of the invention, called SOLFIRE, takes advantage of a new two-phase Subambient Cooling System (SACS) designed and patented by Raytheon (McKinney, Tex.), which can efficiently remove tens, even hundreds kilowatts of waste heat without the need for expensive refrigeration units, requiring only a moderate-sized liquid pump, a reservoir for the working fluid, and a vapor-to-air heat exchanger. In order to reduce costs, ZENTEK is proposing a large aperture structure consisting of a continuous path piping system that can act as the heat exchanger for the SACS system, thus eliminating some of the costs associated with SACS, eliminating a separate heat exchanger and the fan-motor required to move air thought the heat exchanger.

SOLFIRE can also be used as a large collector of thermal energy for generation of steam that can power small, distributed turbine generators at the focal points of the concentrator lenses. The system can use commercial parts to maintain the goal of low cost. For example, automobile air conditioning compressors which are mass produced and can be bought in quantity, can be run in reverse by injecting steam in the output port and act as a steam turbine to power small kW generators. Rotary tools that run on compressed air can also be converted to run on moderate pressure steam.

In order to keep costs at a minimum, SOLFIRE incorporates modular parts that can be mass produced in a clean, all weather, all season factory environment, then transported to the deployment site and built up into the completed system. Many embodiments can be devised for how SOLFIRE can be manufactured and deployed. One, however, which will be illustrated below, maximizes the amount of work done in the factory, and minimizes the amount of work required at the deployment site. In one embodiment illustrated below, the array is built up with 8 ft high×40 ft long sections, pre-joined at the factory, then folded up and sealed into a transportable package 40 feet long, 8 ft wide and 3 to 4 feet deep, with one or two packages transportable on a flat bed truck. At the site, the package is "unfolded" onto a platform consisting of the substructure of the pointing and tracking system, then elevated and put into service.

SOLFIRE is a new solar concentrator system that brings together a number of established technologies with some innovative new concepts in order to radically lower the cost of electric power generation. SOLFIRE could be used for electric power generation via collection of solar thermal energy to generate steam to power turbo-generators, or to covert solar energy directly into electric power using photovoltaic device technology. Although many variants are possible, the SOLFIRE system, for purposes of illustration, is described as a point design, capable of producing 36 kW of electric power based on a built up of 1 kW modular cells each containing a 4 square meter aperture, a 2.5 meter focal length, illuminating a 100 cm$^2$ PV receiver for a concentration of up to 400 suns. The system, of course, is scalable to other apertures, focal lengths and receiver apertures. The 36 kW array is chosen as the nominal size that in turn can serve as a building block to a much larger system, capable of producing megawatts of electric power for the grid. The SOLFIRE point embodiment is for the purposes of illustration only relies on the following technologies, which can be applied to larger or smaller system.

The unit cell contains a square meter silicone lens, e.g. manufactured by 3M on a transparent acrylic support structure. The lens can be flat, curved or domed. A preferred photovoltaic receiver of 27.5% efficient multi-junction (MJ) cells (e.g. manufactured by EMCORE, Albuquerque, N. Mex.) with grid lines appropriate for high levels of solar concentration (e.g. 300-400 suns). An alternative 1 kW turbine generator is powered by the heat from the concentrator lens. A secondary lens system affixed to the PV cell itself directs light around the grid lines (by ENTECH, Keller, Tex.) for increased efficiency.

The new optical subsystem for redirecting stray light illumination back onto the PV cells called SLR (Stray Light Recovery) is applicable to the PV or steam turbine systems.

A two-phase Subambient Cooling System abbreviated SACS (RAYTHEON-McKinney Division) uses a water/glycol or methanol working fluid to efficiently remove the heat from the PV receiver nodes. For example, 36×1 kW PV nodes would require over 100 kW of thermal heat removal.

A multifunctional truss structure for keeping the PV cells aligned, is composed of continuous piping that also serves as the vapor—phase heat exchanger for the SACS system as well as the liquid-phase manifold for injecting the working fluid into each PV receiver subsystem. The system is also capable of re-condensing steam from the turbo-generator. Various new pointing and tracking maintain 1-2 degree pointing accuracy.

SOLFIRE uses on a combination of technical innovations to achieve a low cost system that may not be able to achieve the goal of "one dollar per watt" of capitol investment, but is intended to compete with oil, gas, nuclear. Current market conditions may allow for a system in the $2-3/watt category. This means that a 36 kW SOLFIRE system with have to meet challenging manufacturing goals of $75,000-$100,000 per unit cost. SOLFIRE is designed primarily as a subsystem capable of being replicated and deployed as a multi-megawatt electric power generation system.

The SOLFIRE modular system is aimed at systematically assessing the contributions of several demonstrated solar concentrator technologies, coupled with some new thermal management and structural concepts in order to achieve a low cost, and ultimately competitive renewable energy system design for large, grid-compatible solar electricity generation. The use of high efficiency, but also very expensive, MJ cells for terrestrial use requires solar concentration in order to achieve low enough costs to compete with non renewable power sources (oil, coal, nuclear).

The use of solar concentration is mandated not only by cost, but also by the limited manufacturing capacity of the two principal US vendors, SPECTROLAB and EMCORE. Terrestrial applications of MJ technology must compete with the primary market for MJ cells, which is space power for satellites, where performance, not cost, is the principal driver. SOLFIRE target of 300-400 sun concentration is thus driven by both cost and availability. A SOLFIRE array will use only 1/300 to 1/400 of the area of PV cells required for a comparable planar array system.

The invention provides a scalable array structure containing Fresnel lenses that concentrates sun illumination on a receiver body that generates steam to drive a turbine generator for production of electrical power.

It is an object of the invention to provide a receiver body at the focal point of the concentrating optics that contains PV cells to generate electricity, and a two phase Sub-Ambient Cooling System (SACS) to maintain the an appropriate temperature and prevent overheating.

Another object of the invention is to provide a receiver body at the focal point of the concentrating optics that serves as a steam generator to drive a turbine generator for the production of electrical power.

In the invention the scalable array structure is constructed with pipes with joints that allow the flow of liquid and vapor phases of the working fluid through out the structure.

In the invention the open piping system of the array structure can serve as a heat exchanger to condense hot vapor phase working fluid back to the liquid phase for both the PV system as well as the turbo generator.

The invention provides the open piping system of the array structure that serves as a manifold for the collection of the liquid phase of the working fluid and returns it by force of gravity back to a holding tank at the bottom of the array.

The open piping system of the array structure also serves as a separate manifold for pumping liquid phase working fluid back to the nodes of the array, where it is used by the receiver body for conversion of liquid to vapor phase for one of two purposes, for cooling in the case of the PV SACS system, or for the generation of high pressure steam in the case of the turbo generator, or both.

The invention provides a receiver body that contains a float valve which regulates the flow of liquid into the receiver body, maintaining a proper liquid working fluid level as the working fluid is converted to vapor when heated by the concentrated solar illumination.

As a further object of the invention the receiver body contains a pin/fin arrangement at the base of the illuminated area to facilitate the conversion of liquid phase to vapor phase.

It is a further object of the invention that the Fresnel lens that concentrates the light on the receiver body has multiple focal lengths at the center and at the external portions of the square lens in order to maximize the collection of light on the surface of the receiver body.

An object of the invention is to reduce costs. The new scalable array structure is composed of panels that can be mass produced in a factory environment and are joined in such a fashion that they can be folded up and stowed in a transportable package that can be unfolded at the deployment site with minimum use of personnel and equipment and used for any purpose. The physical dimensions of the new modular cell structure provide transportable modules that may be rapidly assembled in the field.

These and further and other objects and features of the invention are apparent in the disclosure, which includes the above and ongoing written specification, with the claims and the drawings.

BRIEF DESCRIPTION OF THE DRAWINGS

FIGS. 2a through 2e are component panels that make up the array structure.

FIGS. 5a and 5b are cutaway views of the valve at the bottom of the receiver body with valve closed in FIG. 5a and open in FIG. 5b.

FIGS. 8a through 8g show one embodiment of a 2-axis tilt/roll tracking mount to support the 36 kW array illustrated in FIGS. 1d and 1e.

FIG. 9 is a side view of the receiver body acting as a steam generator for the turbine driven generator/alternator.

DETAILED DESCRIPTION OF THE PREFERRED EMBODIMENTS

Figure 1A:
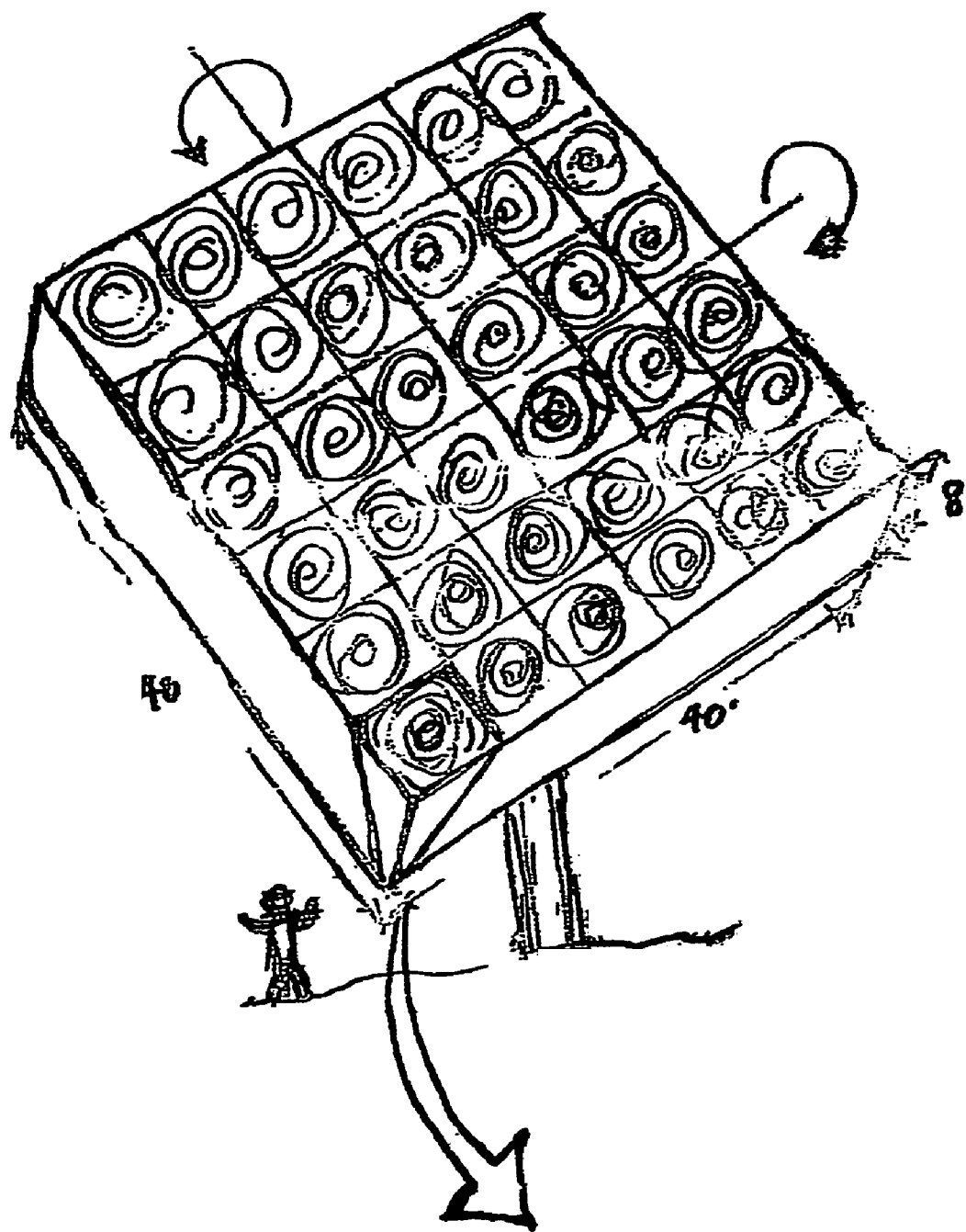
FIG. 1a is a perspective front view.
Figure 1B:
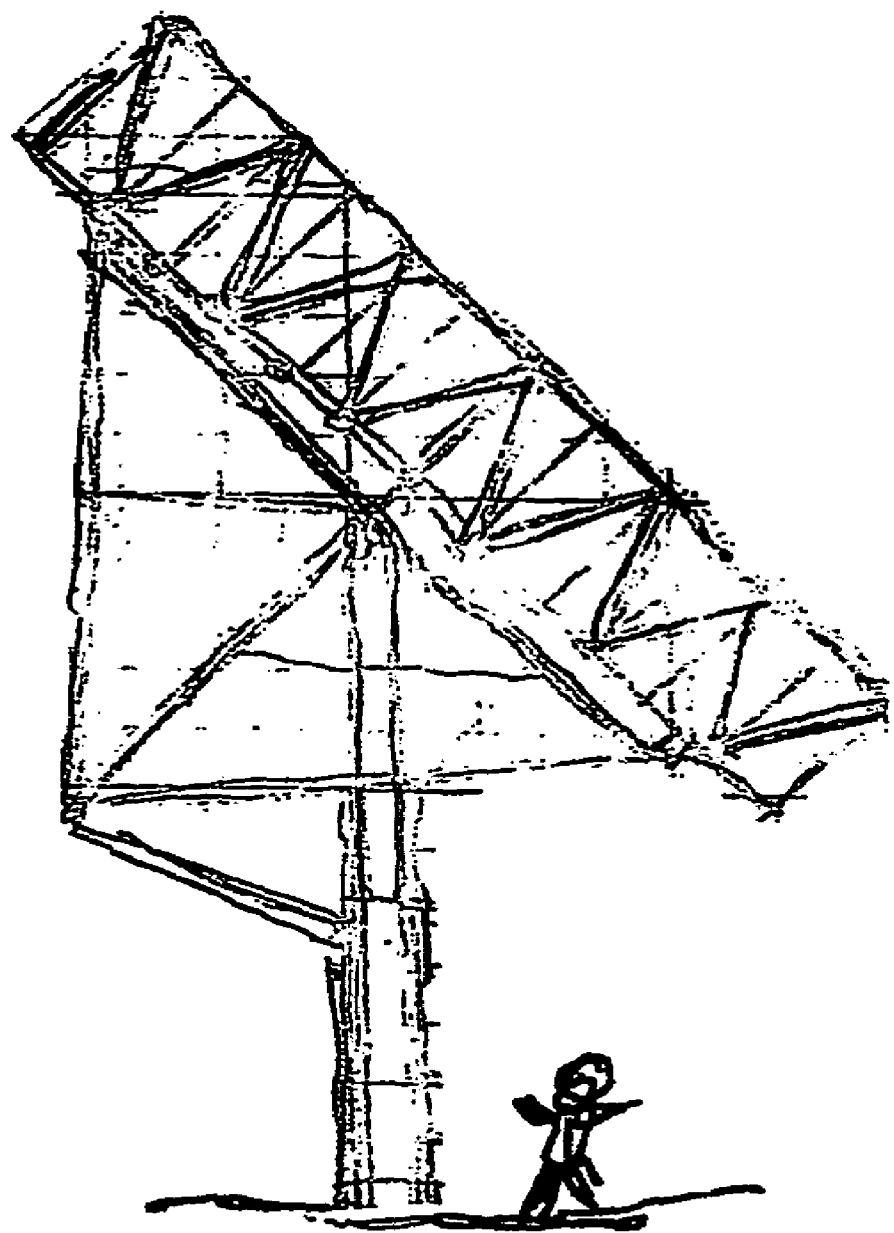
FIG. 1b is a side view of the array structure.
Figure 1C:
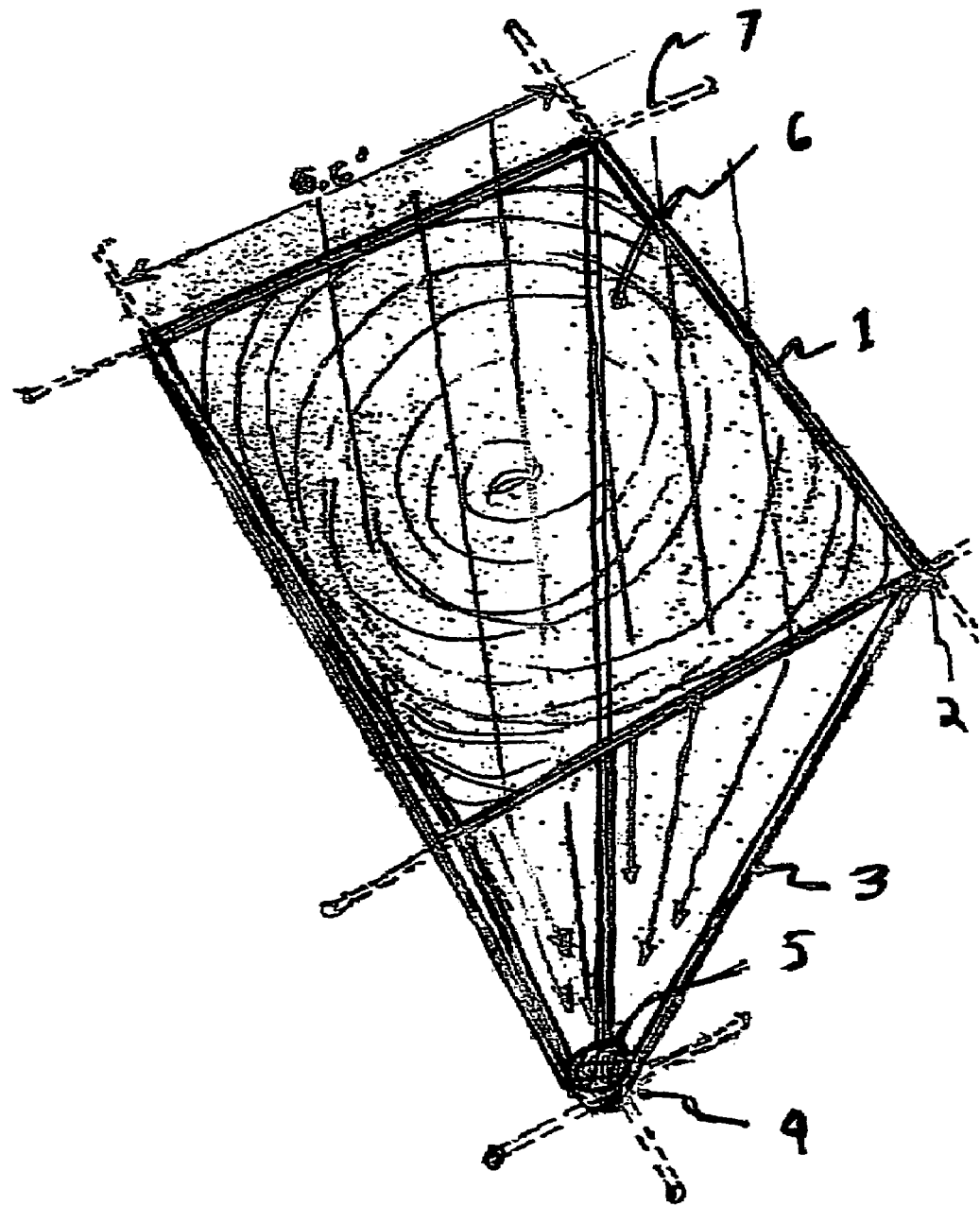
FIG. 1c is perspective top and side view of one of the modular cells within the array.

The SOLFIRE 36 kW array illustrated in the following descriptions has 36 lenses and 36 PV cell receivers in a 40 ft×40 ft square array structure 11 8 ft deep as shown in FIGS. 1*a* (perspective view) and 1*b* (side view). FIG. 1*c* is a blow up of on of the 36 cells that make up the array. The lenses and receivers are held in place by a tetrahedral substructure, hereafter referred to as the Modular Cell, MC. FIG. 1*c* shows the MC as a inverted tetrahedral structure with the base formed by four 2 meter (6.6 ft) long pipes 1 (1" galvanized pipe), connected at each corner 2 with four 2.66 meter (8.25 ft) long pipes 3 forming the sides of the inverted tetrahedron, joined together at the apex 4, providing a very stabile platform for the PV receiver 5. The receiver is located at the focal point of the flat Fresnel lens 6 contained in the base of the tetrahedron. The dotted lines 7 indicate sites where the MC is connected into the larger array structure.

Figure 1D:
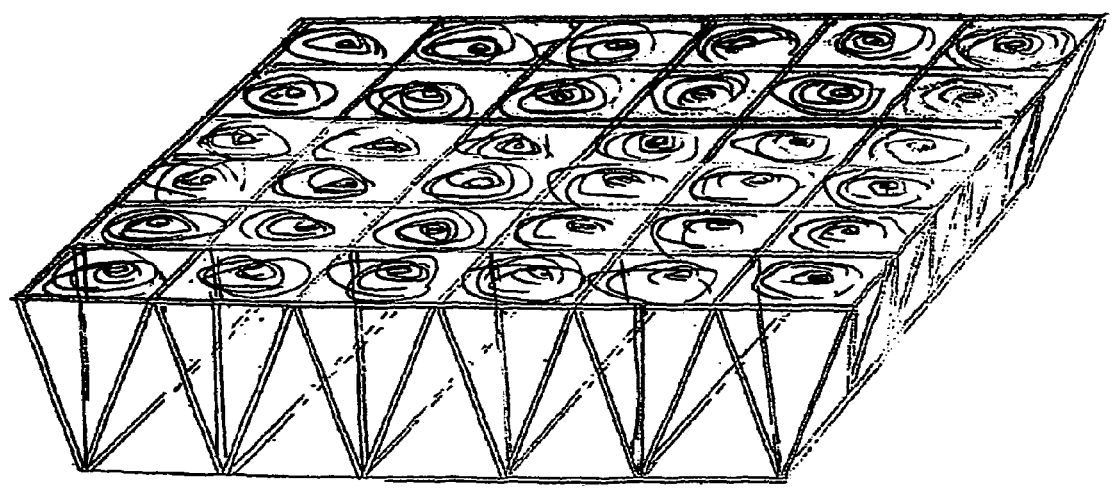
FIG. 1d and 1e are perspective views of the open array structure and the array structure with side panels.
Figure 1E:
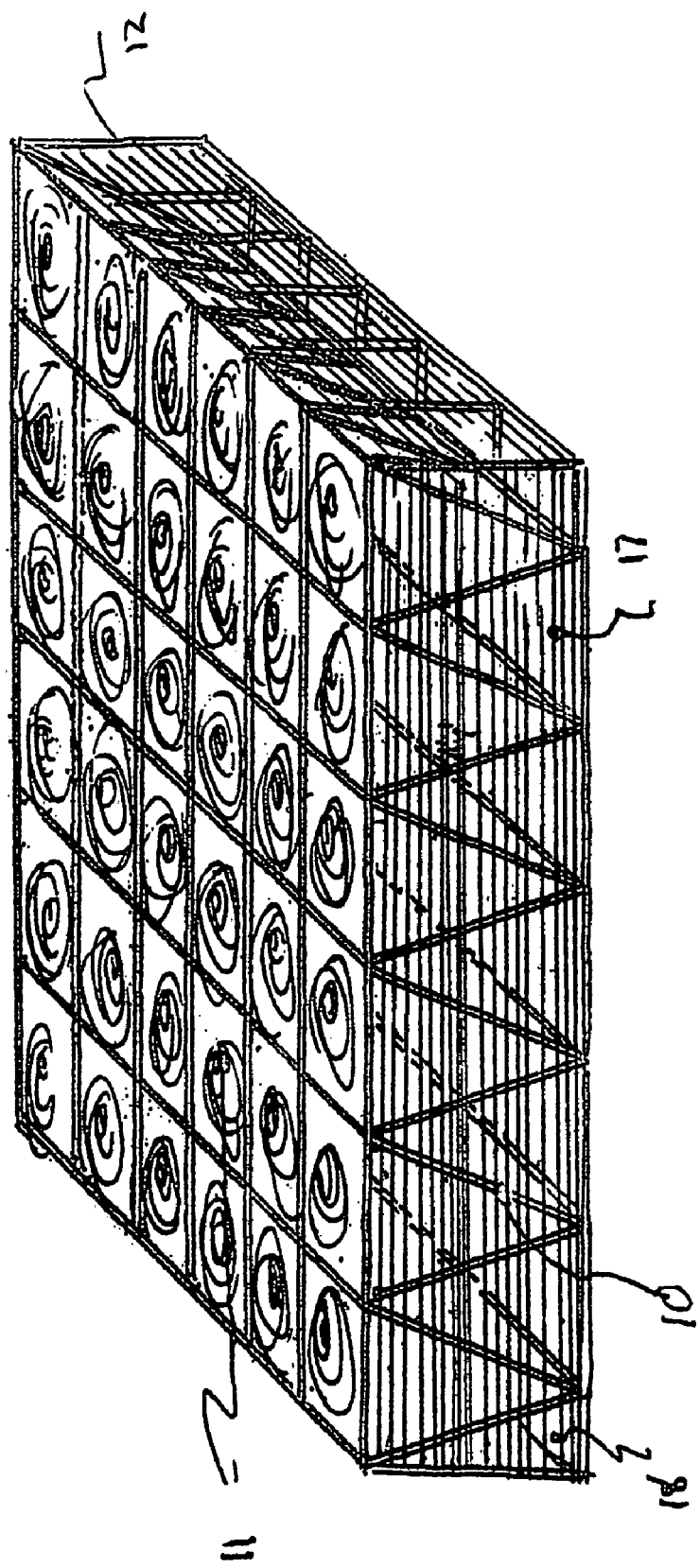

FIG. 1*d* shows an open frame version of SOLFIRE. FIG. 1*e* illustrates a slightly more complex closed frame version with sheet metal sides and bottom providing more protection against the weather, and more surface area for dissipating heat from the SACS system. This truss system, which is described in more detail later, is relatively light weight, but rigid, and can be built up with standard pipes and fittings common in the electrical and plumbing industries. It therefore is low in cost, since these parts are manufactured in quantity for other markets.

Although the array in FIGS. 1*a-e* are shown with flat Fresnel lenses, it is possible to also use curved lenses or domes, as has been demonstrated by ENTECH, which are more tolerant to pointing errors, but may be more costly to produce, and possibly to maintain. Although less tolerant to tracking error, a flat lens would be easier to keep clean from the dust and sand, which can lower the optical efficiency.

Figure 2A:
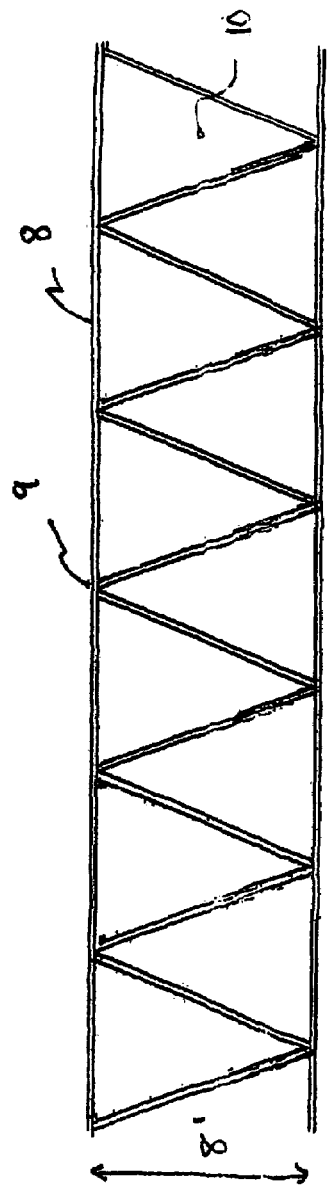

The new array structure is composed of modular cells. The 40 ft×40 ft array structure is built up by fabricating 40 ft long sections, approximately 8 ft wide, containing piping as shown in FIG. 2*a*. The piping 8 is connected in such a manner that the interior of the piping 8 is open and can transport liquid or vapor ranging in pressure from 2 to 40 or more psi as required by the SACS system, depending on the vertical orientation of the receivers.

The piping can be welded at the joints 9, or connected through threaded joints, with connectors and seals similar to those found in the electrical and plumbing industries. At the deployment site, after the structure is fully extended, the threaded joints can be brazed or soldered if necessary to lower the risk of leaks in the sub-ambient and the higher pressures of the sealed SACS system. The soldering of the joints also adds structural rigidity. Prior to the final disposition, the threaded joints allow some of the joints to rotate, which is necessary in one of the deployment embodiments as described. The threaded joints also act as couplers for mating panels to each other at the deployment site.

Figure 2B:
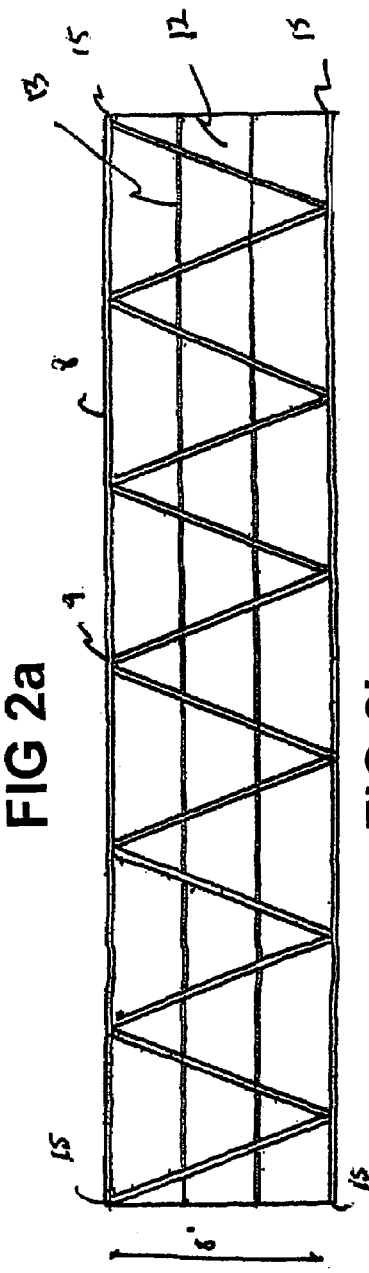

FIG. 2*b* shows a 40 ft wide 8 ft deep panel containing the same layout of piping but with the addition of sheet metal 12 that is can be tack welded and/or brazed to the piping at the factory. This configuration is utilized for the closed truss system shown in FIG. 1*e*. Also shown is optional sheet metal stiffeners 13 affixed to the sheet metal to increase its stiffness without adding substantial weight. All of the attachment points 15 are threaded couplings that allow for on site connection of the panels to each other through these couplings. The sheet metal panels 12 can serve as end panels 12*a* or as side panels 12*b* enclosing the truss structure.

Figure 2C:
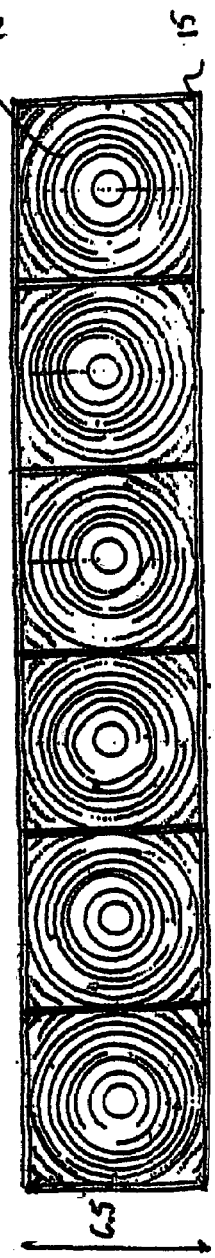

FIG. 2*c* shows a 40 ft×6.5 ft panel containing the Fresnel lenses 16 which when coupled together, form the top of the array structure shown in FIG. 1*c*. The 3M company manufactures silicone lenses in a 1 m wide continuous process which could be ordered in 40 ft lengths to be affixed to acrylic sheet to provide structural stability.

FIG. 2*d* shows an interior bottom panel 17, which when joined through the couplers to other interior panels and to the 40 ft×3.3 ft end bottom panels 18 serves as the bottom of the truss structure enclosure. The piping in the bottom panels are colored black to indicate they are normally filled with the liquid phase working fluid, while the rest of the piping is shown as open piping, is normally associated with the vapor phase in the SACS system. FIG. 2*e* represents a half width bottom panel, which is required if the sides of the array are perpendicular to the bottom plane as shown in FIG. 1*e*.

All of the piping is linked together through welded joints or with the threaded connectors, but the interior of the piping system is open so that it can act as a heat exchanger for the whole array, returning the condensed liquid back to a reservoir where it then can be recirculated to PV cell receivers through the liquid phase network shown in the bottom panels, FIGS. 2*d* and 2*e*.

Figure 3A:
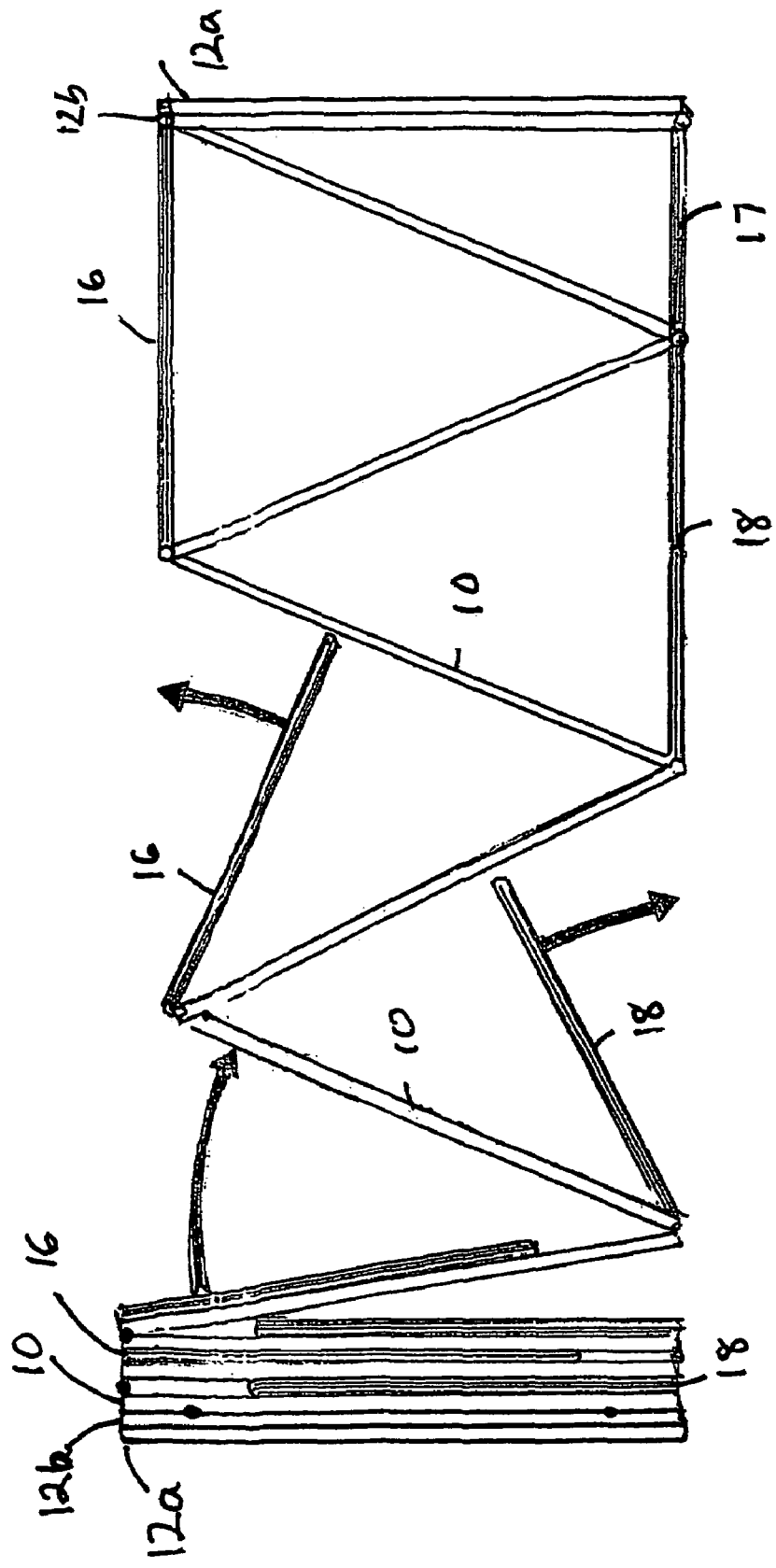
FIG. 3a is a side view of the deployment of the folded array structure panels.
Figure 3B:
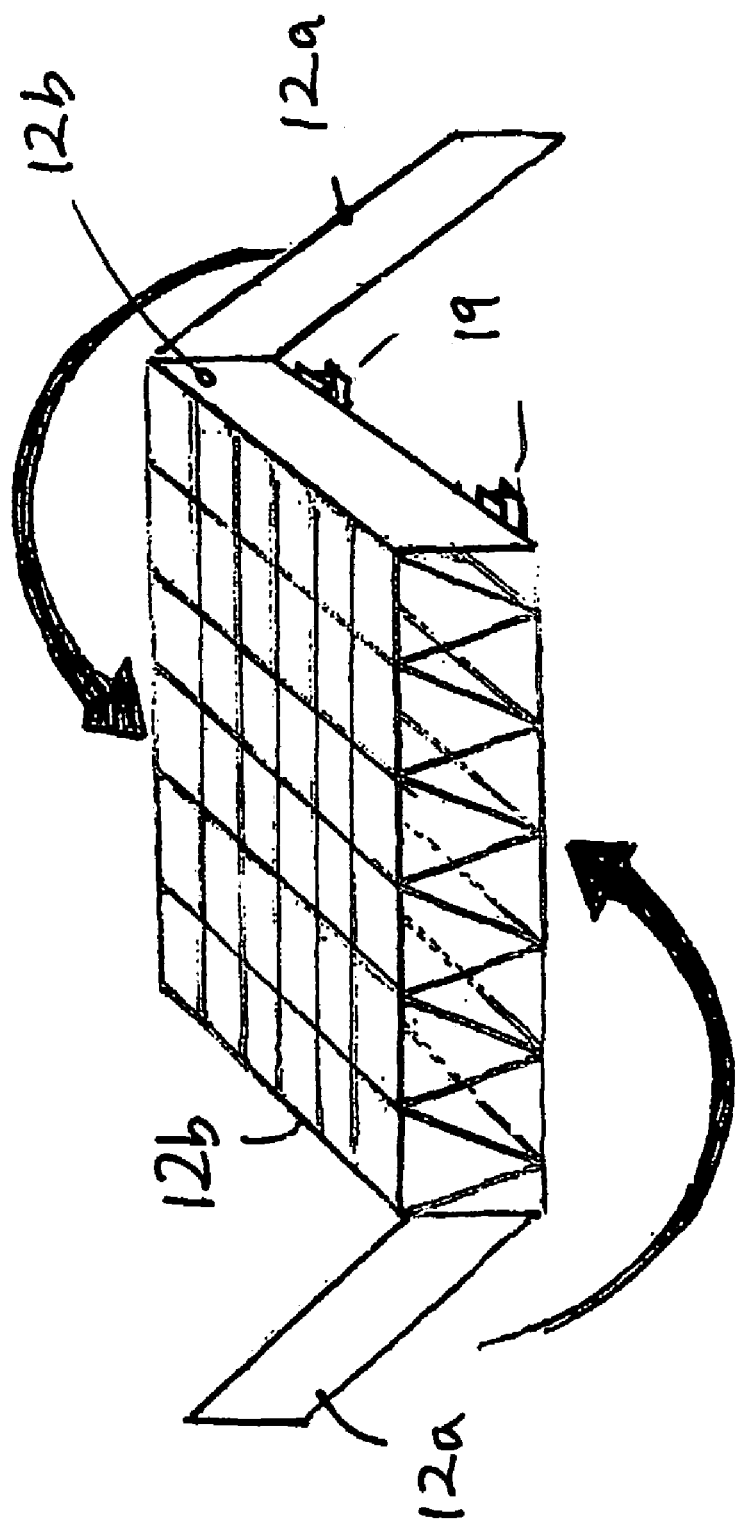
FIG. 3b is a perspective view of the full extension of the folded array with side panels rotated into position.

FIGS. 3*a* and 3*b* shows how the array truss structure can be fabricated at the factory. The large 40 ft panels shown in FIG. 2 can be prejoined at the factory in a manner that allows the whole array structure to be folded up like an accordion, with the lens panels 16 and the bottom panels 17 nested within the folded up truss structure. At the deployment site, the accordion truss structure is unfolded as shown in the FIG. 3*a* overview, with the pleats formed by the pipe structures 10 linked alternately top and bottom by rotatable joints or hinges. The side panels 12*a* and 12*b* are rotated around the corner hinges and connected to the extended truss structures 10 through connectors that can then be soldered or brazed as shown in FIG. 3*b*. The left side of FIG. 3*a*, which is an end-view of the folded truss structure, illustrates how the 40 ft×8 ft sections needed to make up the truss system including lenses and bottom panels are nested into the accordion-like structure. Starting from the left: side panel 12*a* is joined to end panel 12*b* via rotatable joints or hinges along the 8 ft front side. The end panel 12*b* in turn is attached to the first of the pipe structures 10 through rotatable joints or hinges along the top of the 40 ft long structure.

Bottom panels 17 and 18 are nested between truss structure panels 10, which are each joined top and bottom sequentially to form the stowed structure. This sequence of pipe structures 10 hinged top and bottom with rotatable joints or hinges form the pleats of the accordion structure. The lens panels 16 and the end and interior bottom panels 17 and 18 are nested between the pleats, but are attached also to the adjacent pipe structures 10 at the top in the case of the lens panels 16, or at the bottom in the case of the end and interior bottom panels 17 and 18.

The midsection of FIG. 3*a* shows how the accordion structure is unfolded with panels 10 forming the backbone of the pleats. In sequence, bottom panel 18 is rotated down and attached to the bottom of the next pleat edge, with panel 16 rotated up and attached to the top edge of the subsequent pleat edge. This sequence of pipe structure pleats (36 in the case of our 36 kW system) is terminated at the right hand side with the reverse order of the left hand side, that is, with an end panel 12*b* attached to a side panel 12*a* via hinges along the 8 ft dimension on the back side.

FIG. 3*b* illustrates how these side panels 12*a* on the exterior of the folded up package, will be rotated 270 degrees after the accordion structure is extended to form the sides of the truss array. FIG. 3b shows the packaged array after deployment resting on two or more 40 ft beams which provide the back structure of the array, and the primary structure of whatever tracking mechanism is employed which will be described later.

In the above paragraphs, reference has been made to pipe structures, end and side panels, lens panels and bottom panels as being hinged, or joined with rotatable joints. The term rotatable joints refers to versions of SOLFIRE where panels can be joined by sharing a common pipe along the seam of the "pleat." This adds a level of complexity but eliminates redundant pipes at the pleat edges.

This accordion-like structure is the preferred way of transporting the panels to the site for deployment, but not the only way. In alternative methods the panels could be transported separately to the site and joined at the site, although this would require additional equipment such as cranes, and additional manpower to handle, align, and attach each panel. This could become a daunting task with 40 ft×8 ft panels only 1½ inches thick, subject to winds, bending, etc.

Figure 4A:
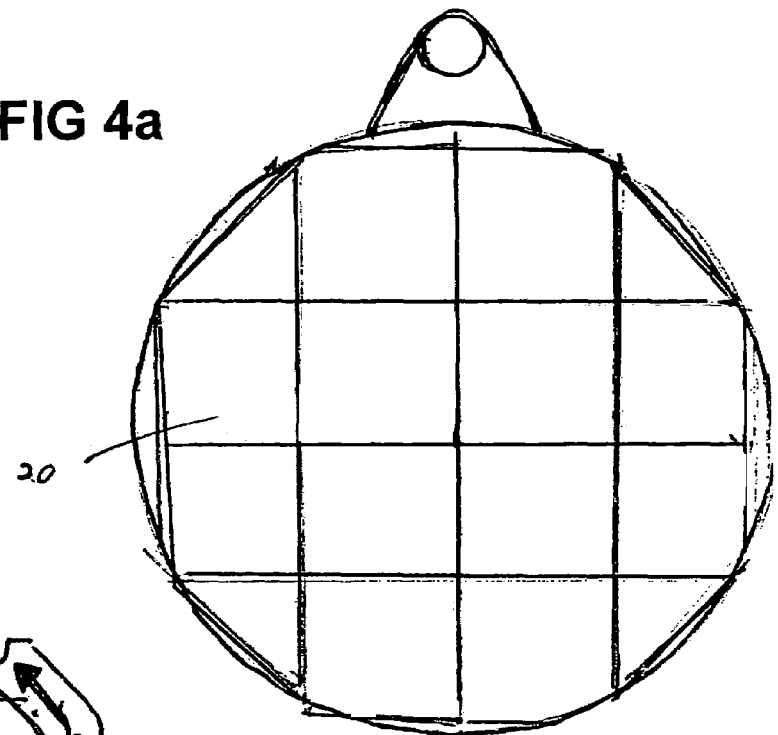
FIG. 4a is top view of a receiver.
Figure 4B:
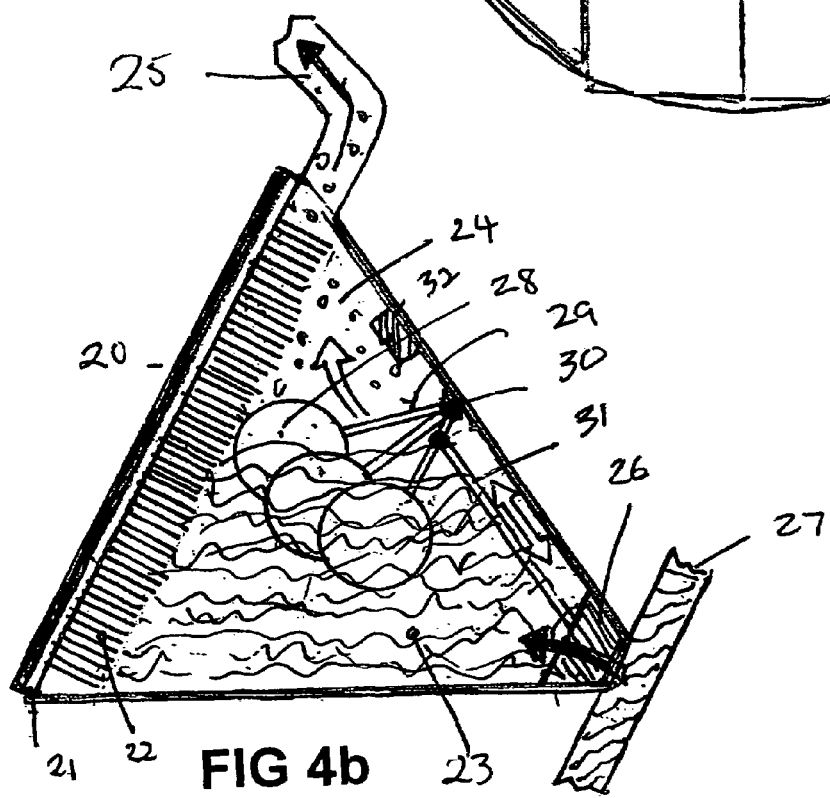
FIGS. 4b and 4c are side views of the receiver body in two orientations (low angle and high angle).
Figure 4C:
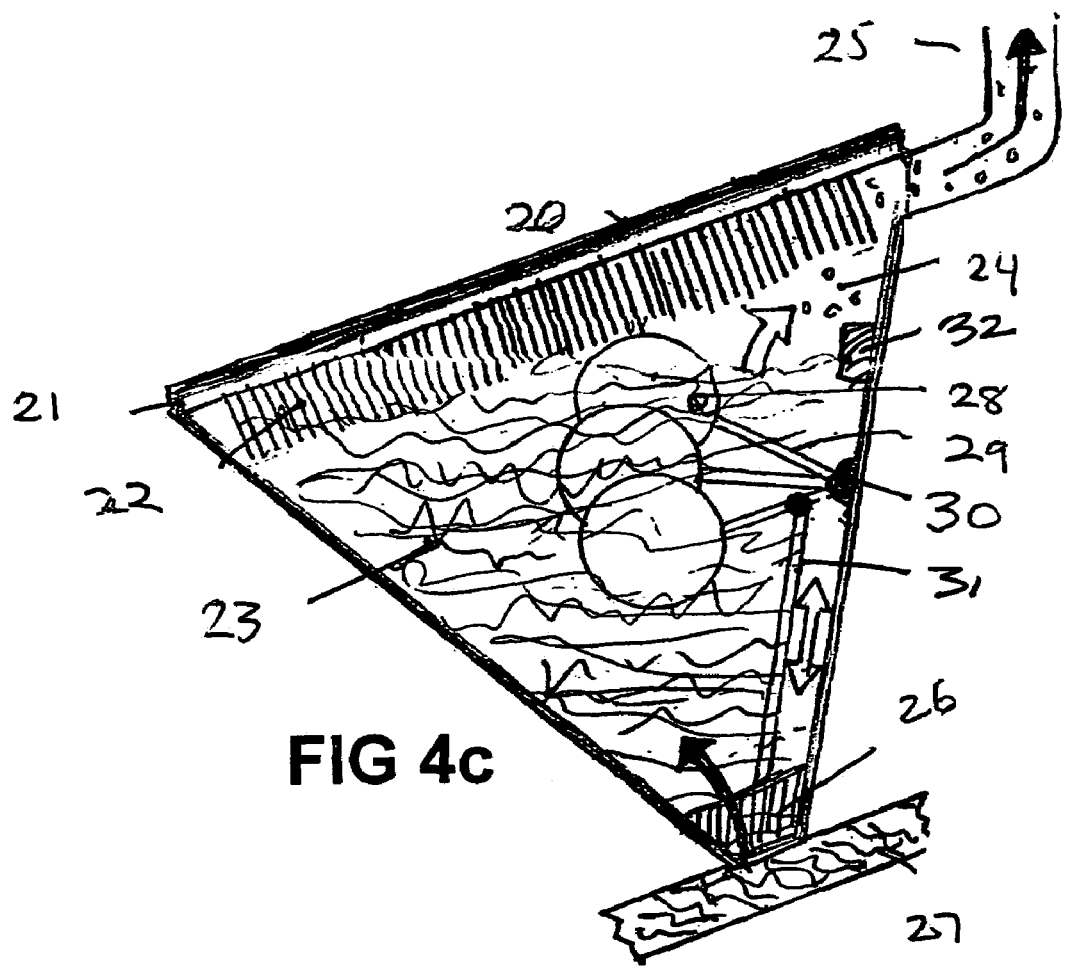

Photovoltaic receivers have thermal management system. FIGS. 4a-4c show views of a photovoltaic (PV) receiver 5 located at the apex 4 of the modular cell. FIG. 4a is a top view of the multi-junction PV cell connected in series and parallel depending on the desired line voltage, mounted on the base of the conical-shaped receiver.

FIG. 4b is a side view of the cone-shaped receiver body, which has of a number of components required for the SACS two-phase thermal management system. The PV cells 20 are mounted on a base plate 21, to which are attached or cast into the plate numerous fins or pins 22 that facilitate the transfer of heat from the PV cells to the liquid phase of the SACS system. The liquid phase of SACS (glycol water mixture or methanol) is shown filling most of the body of the receiver 23, touching the lower portion of the base plate.

The conversion of liquid to the vapor phase, occurs in the matrix of pins in the base plate. The vapor collects at the top of the receiver 24, exiting through an orifice 25 at the top of the receiver. This orifice, as shown in later graphics, must always be higher than the level of the liquid phase, regardless of the orientation of the receiver, within certain limits. The orifice 25 is connected into pipe 5, which allows the vapor to be transported throughout the array structure, which is in contact with the ambient air. The vapor, losing heat, re-condenses into the liquid phase and through gravity trickle down to a holding tank at the base of the array.

Because the system is maintained a low, sub-ambient pressure of 2-3 psi, the liquid boils at a low temperature (60-65 C), and thus can remove kilowatts of waste heat in the receiver, maintaining the temperature of the PV cells at an acceptable level.

As the liquid boils away, it is replenished through a valve system 26 at the apex of the cone-shaped receiver that meters the liquid working fluid from a manifold 27, which is maintained a much higher pressure (30-40 psi) than that of the receiver. FIG. 4c shows the receiver tilted up when the sun angle is closer to the zenith. The two orientations shown in these figures correspond to the minimum and maximum angles that the receiver will be tilted for systems deployed between latitudes 30 and 40 degrees, which include the desert Southwest, United States, the most desirable deployment area for large power grid applications.

The valve is controlled by a float system having a float 28 connected by a rod 29 to hinge 30 mounted on the side of the receiver body. The rotational motion of the float is transferred to liner motion by a connecting rod 31 that transfers the motion of the float 28 to the valve body 26.

The float system described above is mechanical, with a mechanical feedback loop. Other systems may be used such as an electromechanical system. A sensor located between the liquid/vapor interfaces 32, triggers a solenoid electromechanical valve when the liquid level is low and replenishes it.

The same type of float system can be used for the turbo generator where concentrated sun light impinges on the surface (base of the cone) containing a heat absorber, which transfers heat to the pins or fins, which in contact with the liquid phase (water) generates steam. This system would operate at a much higher internal pressure in order to generate high-pressure steam for the turbo generator.

Figure 5A:
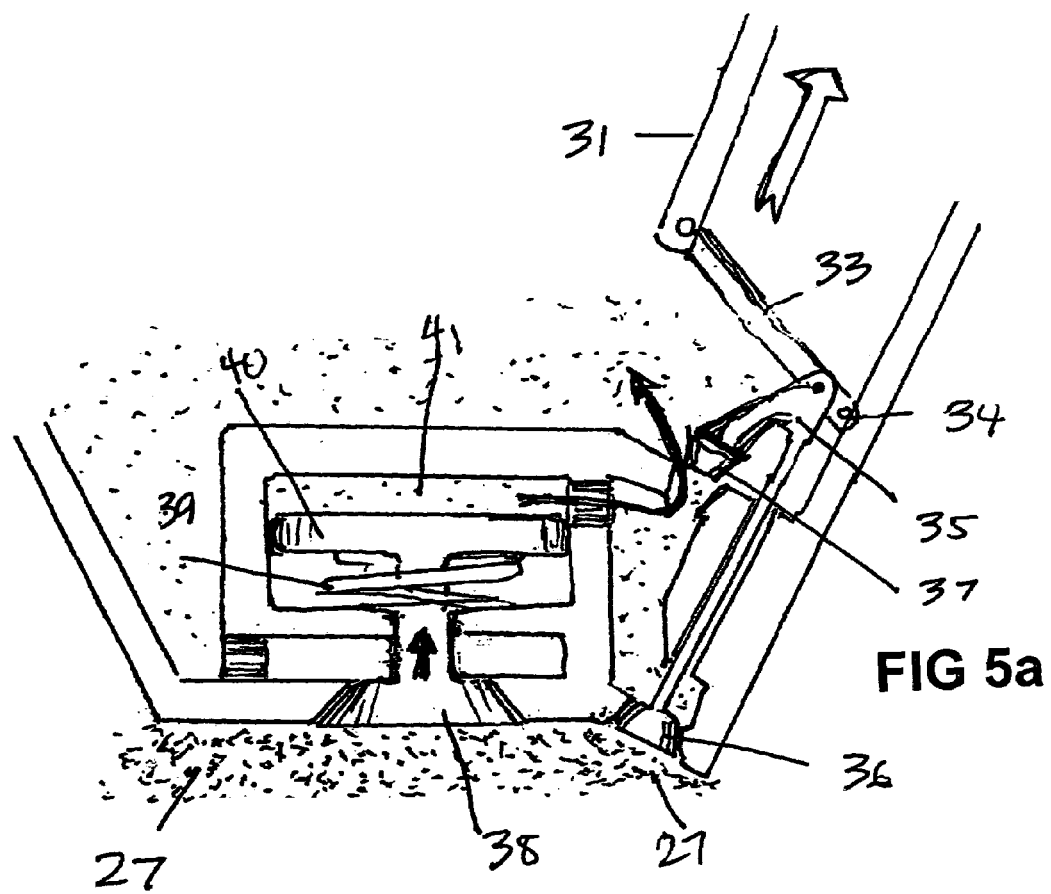

The new mechanical valve systems control flow of the fluid. FIGS. 5a and 5b show the operation of a pilot valve driven main valve, which is opened and shut by the translational motion of the connecting rod 31 between the float system and the pilot valve. The connecting rod 31 is linked to an intermediate rod 33 hinged at 34 to the side of the receiver body. The intermediate rod is connected to yoke 35, which is mechanically linked to the pilot valve 36 and the relief valve 37.

The pilot valve is shut, and the relief valve 34 open, as shown in FIG. 5a, caused by the float being in the up position meaning the receiver is full of liquid. The main valve 38 is shut and held shut by spring 39. The higher pressure liquid shown as heavy shading, in manifold 27, is not allowed to enter the valve body. The volume 41 above the large valve piston head 40 is in equilibrium with the low-pressure liquid in the interior of the receiver, because relief valve 37 is open.

FIG. 5b shows the situation when the liquid in the receiver goes down and requires replenishment. In this situation, connecting rod 31 reverses direction, opening pilot valve 36, closing relief valve 37, allowing high pressure liquid in 27 to enter the volume 41 above the piston head 40, compressing spring 39, depressing the piston and opening valve 38, which admits high pressure liquid into the receiver body to replenish the level of the reservoir. After the liquid level has risen and again raised the float, the process is reversed, shutting the pilot valve, opening the relief valve, and allowing the compressed spring 39 to push the liquid in volume 41 out into the receiver through relief valve 37, restoring the equilibrium condition shown in FIG. 5a.

Figure 6A:
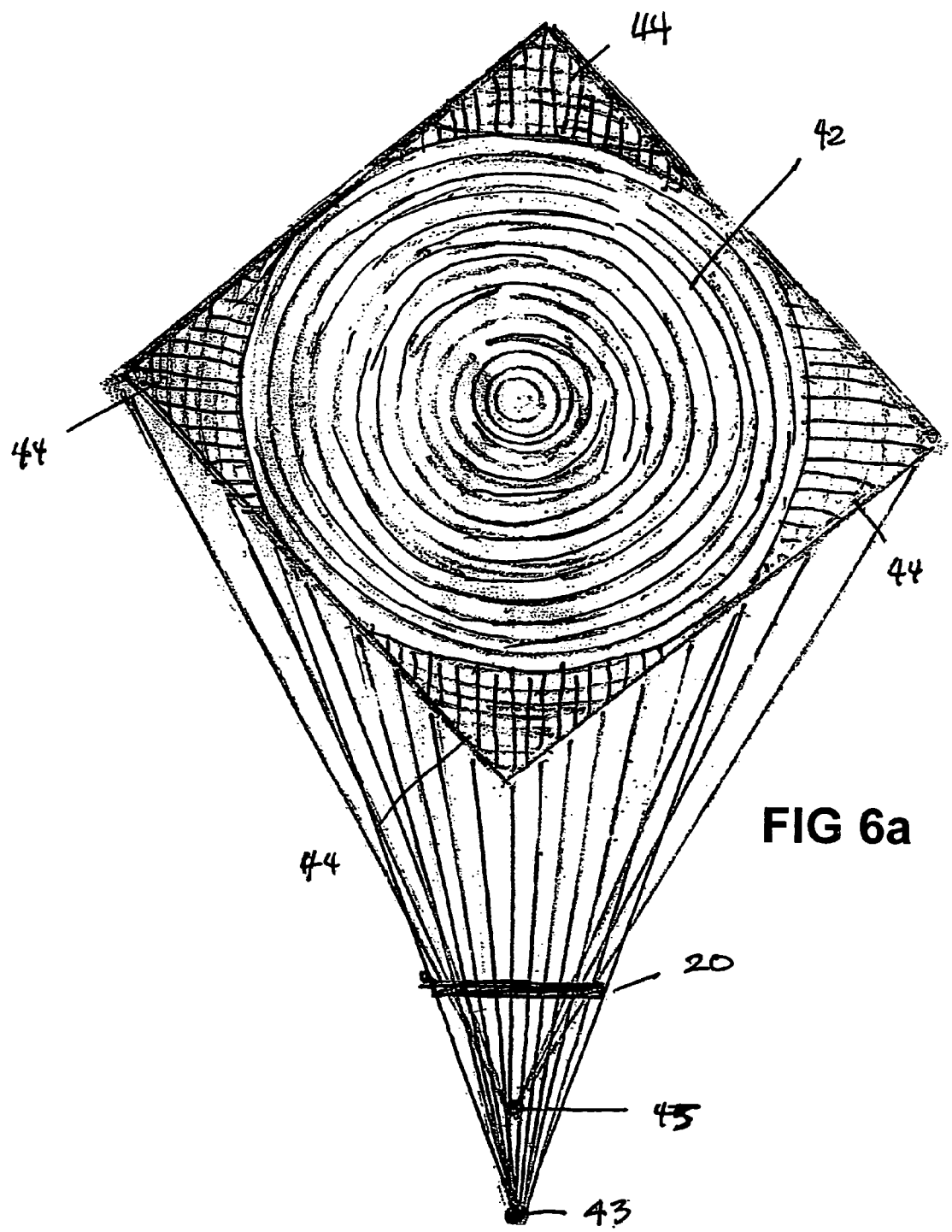
FIGS. 6a and 6b are perspective views of the Fresnel lens concentrating the solar illumination on the top of the receiver body photovoltaic (PV) cells, with the focal points of the bifocal lens below the PV plane in FIG. 6a and above the plane in FIG. 6b.
Figure 6B:
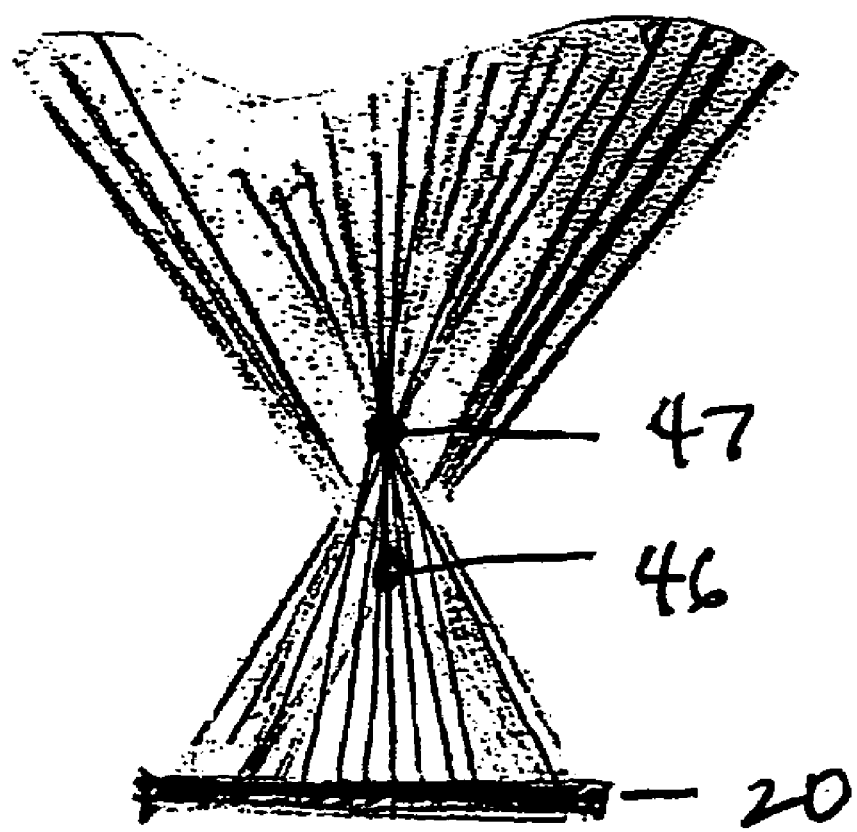

Bifocal Fresnel lens are preferred. FIGS. 6a and 6b show a flat Fresnel lens that has separate focal lengths for the interior and exterior portions of the lens in order to efficiently utilize all portions of the square lens to project onto a round PV cell receiver assembly. FIG. 6a show the circular symmetric portion of the lens 42 bounded by the four corners of the square projecting onto focal point 43 intersecting the full width of the circular PV assembly 20. The four sectors of the outer portion of the lens 44 the shaded portion outside of the circular portion designated 42, but bounded by the square, is constructed with a shorter focal length 45 so that its rays also intersect the circular PV assembly. In FIG. 6a, the focus points are below the PV assembly 20.

In an alternative embodiment shown in FIG. 6b, the focus points are above the PV assembly, between the lens and the PV assembly. In order to project fully on the PV assembly, the order of the focal points are reversed. The rays from the outer portion of the lens 44, converge on focal point 46, above the PV assembly 20, but below the convergence of rays from the interior portion of the lens 42, which converge at focal point 47. Both portion of the lens flood the PV assembly 20.

Figure 7:
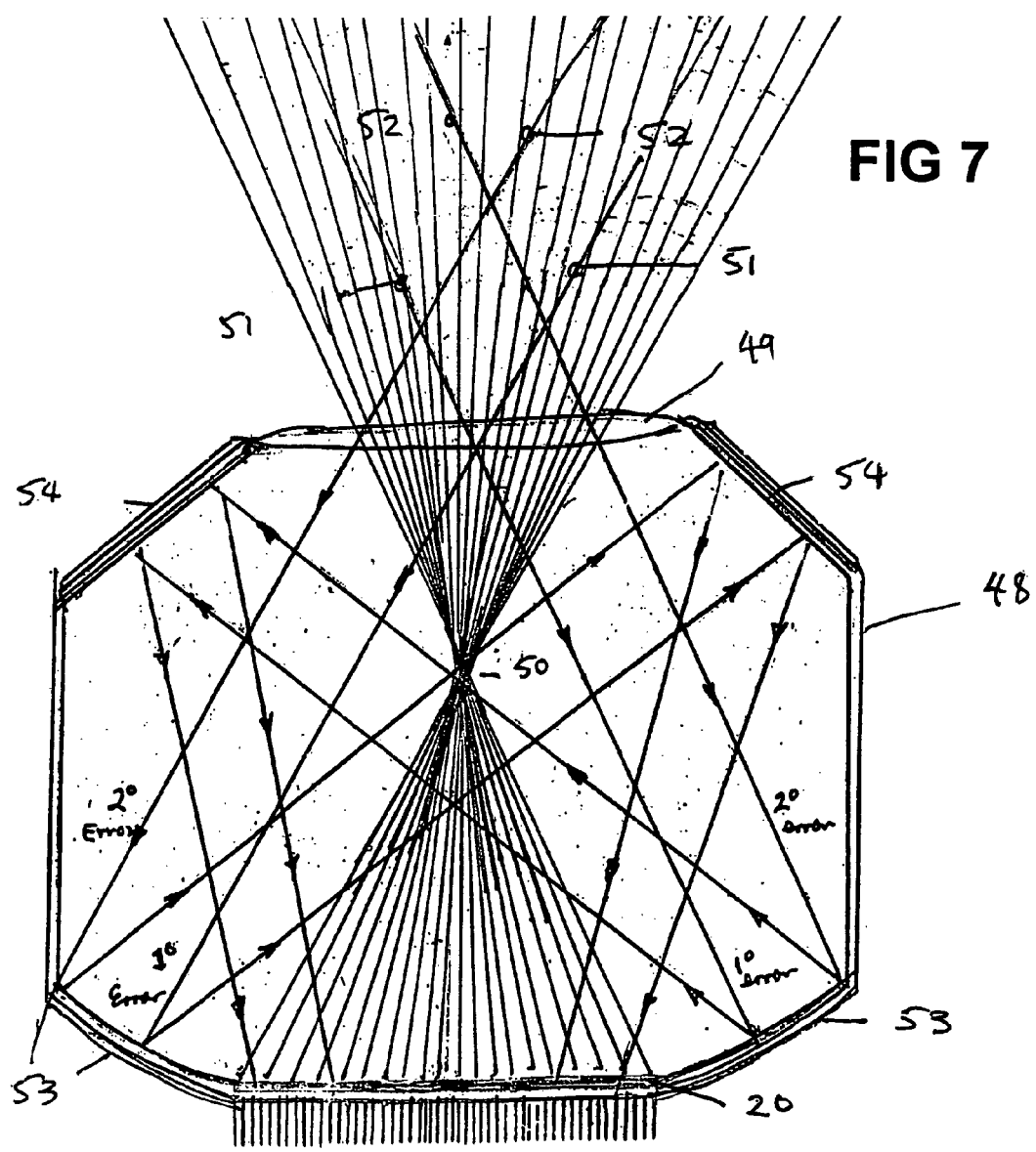
FIG. 7 is a side view of the Stray Light Recovery (SLR) system optical paths.

A new reflective optics assembly provides stray light recovery (SLR). FIG. 7 shows a reflective optics scheme, the Stray Light Recovery system (SLR) 48 that redirects light resulting from pointing errors (1 to 2 degrees) back onto the PV module. Solar irradiance concentrated by the Fresnel lens enters the top of the SLR assembly 49 through the focal point 50 and onto the PV cells 20. Ray traces 51 and 52 representing light that emerged from the outer portion of the Fresnel lens which were subject to 1 to 2 degrees of pointing error respectively, are shown reflected off of curved reflective optical surfaces 53 at the bottom, on either side of the PV assembly 20, back up to the opposite side and upper portion of the SLR 48, where it is again reflected downward from reflective optical surfaces 54 onto the plane of the PV module 20. Although there are some losses due to the reflection off of the two surfaces 53 and 54, it is estimated that 80% or better of the light which would have been lost falling outside of the boundary of the PV cells, could be recovered to generate current in the PV assembly.

The SLR system in FIG. 7 is illustrating use in a spot focus application, but could also be used in a line focus application similar to that used by ENTECH and others. The SLR system could also be used for the turbo generator application by increasing the amount of light impinging on the heat absorber.

Figure 8A:
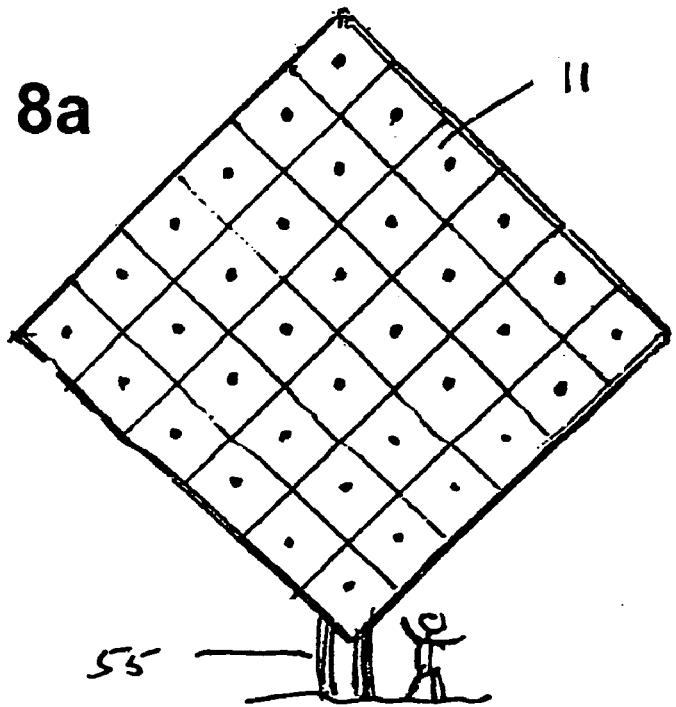

The new SOLFIRE dual axis tracking mount provides solar or target pointing accuracy. FIGS. 8a through 8g show one embodiment of a 2-axis tilt/roll tracking mount to support the 36 kW array illustrated in FIGS. 1d and 1e. FIG. 8a is a frontal view of the array structure 11 rotated 90 degrees in a diamond configuration with one corner at the uppermost point of the array and the opposite corner in the lowest point. This diamond configuration as will be seen in FIG. 8b aids the flow of the re-condensed working fluid of the SACS system, where the liquid phase flows back to the lowest point of the array through the influence of gravity.

Figure 8B:
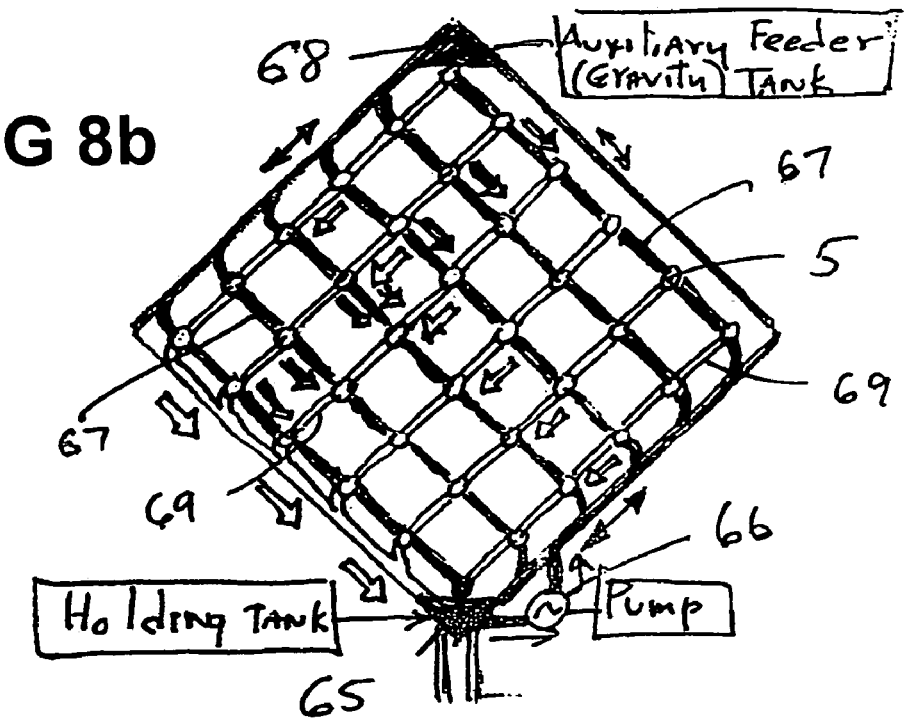
Figure 8G:
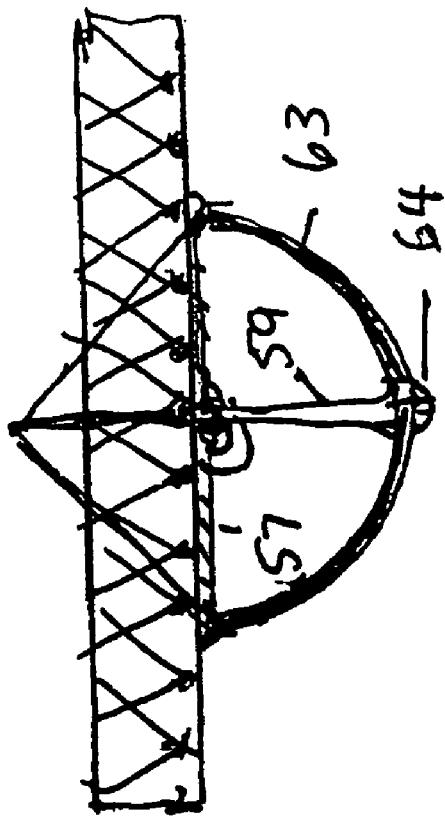
Figure 8F:
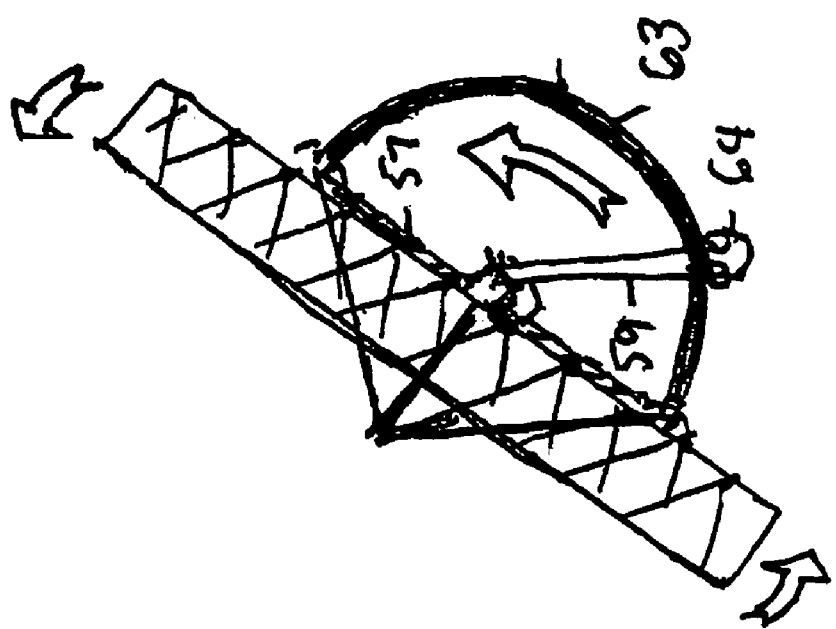

FIG. 8b is the back view of the array showing the various manifold systems for distributing the liquid phase working fluid to each of the receivers 5 through the bottom panel piping system 17 and 18 shown in FIGS. 2d and 2e. Liquid accumulated in the holding tank 65 is pumped via pump 66 up the array shown as black piping 67 up to the auxiliary tank 68 where it is distributed to all the receivers 5 via the piping network 67. After the liquid phase has been converted to the vapor phase in receivers 5, the vapor is distributed throughout the open piping system 69 (shown as white piping in the figure). When the vapor phase is re-condensed into the liquid phase by contact with the piping at ambient air temperature, it is returned to the holding tank through the open piping system 69 shown by the white arrows in the figure. From there the liquid is pumped to the auxiliary tank 67, for redistribution to receivers 5 through manifold 67.

FIG. 8c shows the backside of the array supported by pillar 55, which is linked to the array through a gimbaled mechanism 56, which is described in the accompanying figures. The light-weight array 11 is supported by a stout array support structure 57 shown as a cross-hatched rectangular structure in the interior array, attached to the backside of the array, and hinged top and bottom 58 to a T-shaped member shown in side view FIGS. 8d and 8e. This "T bar" is linked to the pillar 55 via a rotatable joint 60 and acts as the tilt mechanism for adjusting the array in the North-South direction as shown in side views FIGS. 8d and 8e. The "T bar" is augmented structurally by diagonal support members 61, is driven by an extendable screw jack 62 which positions the T bar and secures it in place at the angle required for sun tracking, rotating the array in the North-South plane. The insert above 8e shows this N-S rotation around axis b. The insert figure above FIG. 8e also shows the array roll mechanism in the East-West plane where support structure 57 linked to the T bar 59 via rotatable joints 58 is allowed to rotate around axis a in the E-W direction, driven and held in place by a large diameter wheel 63 driven by means of a motor at 64. This motion is illustrated in the top view of the array in FIGS. 8f and 8g. Alternatively, the large diameter wheel can be driven and held in place by a cabling system as described in U.S. Pat. No. 6,302,009 "Modular Solar Tracking Frame" issued Oct. 15, 2001.

Turbo generator alternative uses similar methods and apparatus. The turbo generator would share many of the attributes of the SOLFIRE concept for PV electrical generation such as: (1) the distribution of the liquid working fluid to each of the nodes via the piping system shown in FIG. 8b; (2) the metering of the liquid phase into the cone shaped steam generator shown in FIG. 4; (3) the mechanism for maintaining the pressure differential between the liquid and high pressure gas phase as shown in FIG. 5; (4) the lens concentrator and SLR systems shown in FIGS. 6 and 7; (5) the open piping system used to condense the gaseous phase back to liquid phase.

FIG. 9 shows additional turbo generator hardware that processes the steam coming from receiver 24 through orifice 25 into turbine 70, which is connected to the alternator/generator 71. Note the steam exiting the turbine 72 is connected into the open piping system 69 for circulation into the SOLFIRE structure, with subsequent condensation by contact with the piping at ambient air temperature, and return of the condensed working fluid back to the holding tank 65.

The turbo generator variant differs from the PV variant in several ways. The turbo generator could use working fluids including, but not limited to water, glycol, or methanol, and could operate in different pressure regimes than were discussed for the PV system. For example, the vapor side of the system would not necessarily operate at 2-3 psi, which was required to keep the base of the photovoltaic at 60-65 C. The turbo generator could run a pressures greater than ambient pressure (14 psi) and thus at higher temperature for the steam exiting the receiver. In fact, for the turbo generator case, it is desirable to have the pressure and temperature as high as possible coming out of the receiver 25 with lower pressure, lower temperature steam exiting the turbine 72.

In place of the photovoltaic cells 20, the turbo generator alternative would have a heat absorber 73 which could use a phase change salt that would liquefy, store and spread the heat at hundreds of degrees Centigrade, and a layered insulator plate 74 having optically coated gas enclosing a vacuum chamber 75.

Solid state radar and other alternative systems employ the erecting and pointing and tracking methods and apparatus.

Figure 10:
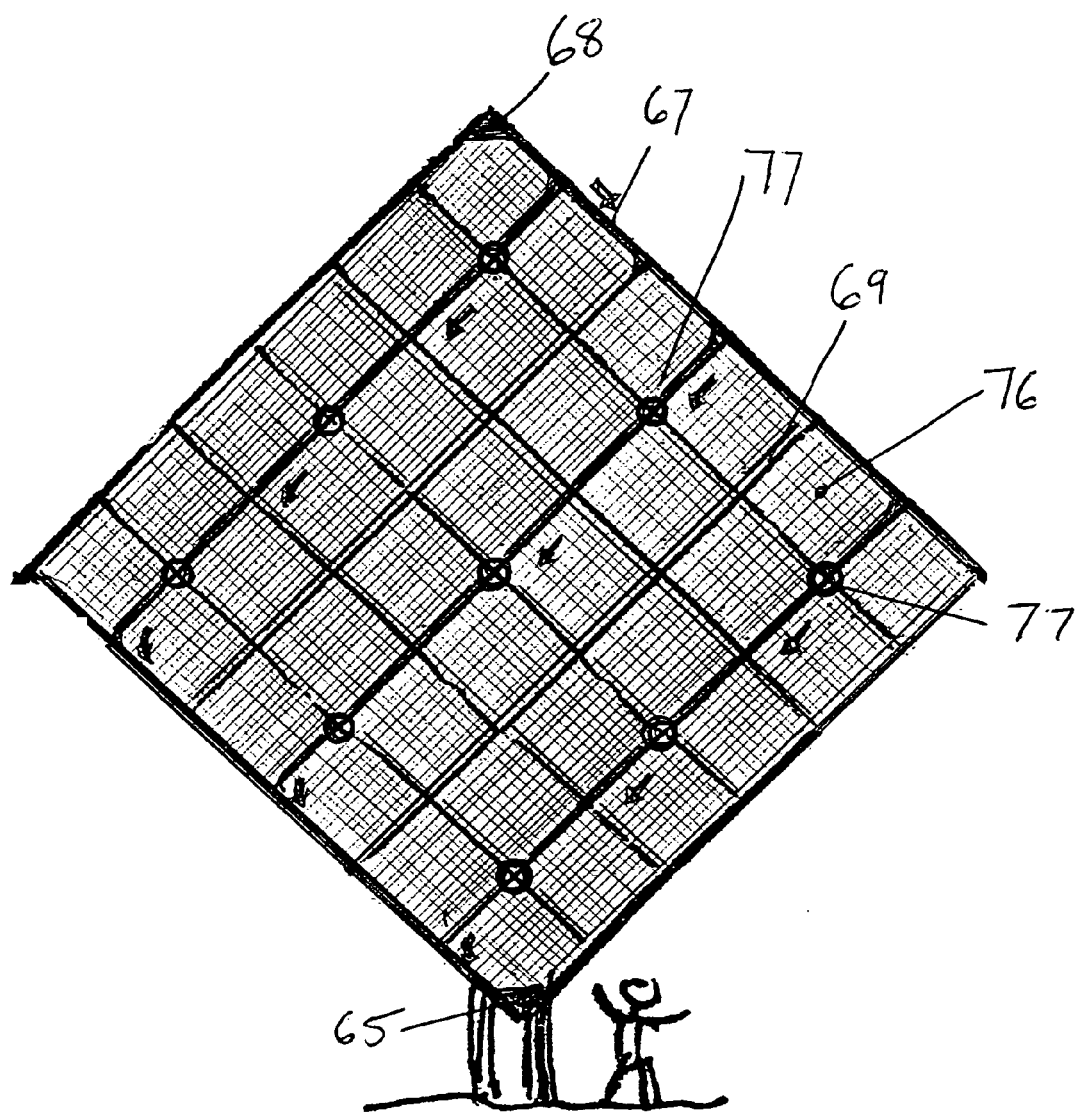
FIG. 10 shows a radar erected on the new array structure.

Although the principle application of SOLFIRE described above relates to generation of electricity via photovoltaic or turbo generators, nonetheless, many of the concepts and designs related to SOLFIRE could be utilized in other applications, such as a large solid-state radar, the front view of which is shown in FIG. 10. The new methods and apparatus include the basic transportable and deployable structures shown in FIGS. 1,2 and 3, valve system shown in FIGS. 4 and 5, the two axis tracking system shown in FIG. 8, and aspects of the two phase SACS cooling system described throughout In the case of the radar, the lenses of the SOLFIRE are replaced by large panels of solid-state, high power electronics 76 and radiating elements that require cooling which can be accomplished with the two phase SACS system. In the case of the radar shown in FIG. 10, the liquid phase supply manifold is on the font face of the array instead of the back as shown in FIG. 8. The liquid working fluid accumulated in holding tank 65 is pumped up to auxiliary tank 68 and then distributed via the black piping 67 to nodes 77 where the liquid phase can be distributed into four adjacent panel 76 for use in cooling the high power electronics. Each node 77 contains one of the valve systems shown in FIGS. 4 and 5 without the photovoltaic cells, to regulate the pressure of the liquid phase, which is distributed to the four adjacent panels around the node. Here the liquid phase is converted to vapor phase, removing heat from the high power electronics. The vapor phase is connected to the return manifold 69 shown as open piping and is distributed throughout the open piping structure of SOLFIRE for condensation to liquid phase, which in turn is returned by gravity to the holding tank 65.

For lower power radars not requiring two phase cooling, some of the attributes of SOLFIRE could also be utilized such as the transportable and deployable structure and the two axis tracking.

SOLFIRE provides for a large array of individual modules that collect light from a Fresnel lens onto a unique PV assembly that allows excess heat to be removed via the SACS thermal management system, or in the case of the turbo generator, with steam condensed at higher pressures. The structure itself is composed of open piping. Vapor generated in the receiver can circulate throughout the piping, the exterior of which is exposed to the ambient air at a lower temperature than the vapor. This allows the vapor to be re-condensed into a liquid, with gravity pulling the liquid down through the structure into a holding tank at the bottom of the array, where it can be pumped back to the receivers though a high-pressure liquid phase manifold. Or, preferably, as an alternative, the liquid from the holding tank can be pumped up to an auxiliary tank at the top of the array where it can be connected into the manifold so that gravity feeds liquid through the manifold back to the individual receivers. In the case of the PV system, the vapor pressure in the piping structure is 2-3 PSI. In the case of the turbo generator, the vapor side of system could operate at much higher pressures than the SACS system, since it is desired that the boiling temperature of the working fluid be maximized for turbine efficiency, rather than being minimized for photovoltaic cell efficiency. It is an object of the invention to develop a scalable array structure containing Fresnel lenses that concentrates sun illumination on a receiver body containing photovoltaic (PV) cells for the generation of electrical power.

While the invention has been described with reference to specific embodiments, modifications and variations of the invention may be constructed without departing from the scope of the invention, which is defined in the following claims.

I claim:

1. A solar concentrator system comprising:
   a frame having an inverted pyramidal structure, the frame having a top, a base, and sides between the top and the base;
   an array of Fresnel lenses arranged on the top for focusing solar rays;
   individual inverted conical receivers spaced under the Fresnel lenses for receiving the focused solar rays;
   photovoltaic cells on the receivers for receiving the solar energy focused by the Fresnel lenses;
   heat exchanger extensions under the photovoltaic cells for transferring heat from the photovoltaic cells;
   liquid in the receivers contacting the heat exchanger extension for transferring heat from the heat exchanger and boiling the liquid into a vapor;
   vapor remover tubes connected to the receivers for removing vapor from the receivers; and
   a liquid supply connected to the receivers for supplying the liquid to the receiver in contact with the heat exchanger.

2. The system of claim 1, wherein the heat exchanger extensions further comprise pins or fins extending from the heat exchanger toward a narrow base of the receiver.

3. The system of claim 1, wherein the receivers have apexes opposite the photovoltaic cells, wherein the vapor remover tubes are connected to the receivers near the photovoltaic cells and the liquid supply is connected to the receivers near the apex.

4. The system of claim 1, further comprising sensors connected to the receivers and to the liquid supply valves connected to the receivers and the liquid supply and to the sensors for controlling liquid level in the receivers.

5. The system of claim 4, wherein the sensors are floats in the receivers.

6. The system of claim 5, wherein the floats are connected to links for opening valves to the receivers.

7. A solar concentrator system comprising:
   a frame having a tetrahedral structure, the frame having a top, a base, and sides between the top and the base;
   an array of Fresnel lenses arranged on the top for focusing solar rays;
   individual inverted conical receivers spaced under the Fresnel lenses for receiving the focused solar rays;
   photovoltaic cells on the receivers for receiving the solar energy focused by the Fresnel lenses;
   heat exchanger extensions under the photovoltaic cells for transferring heat from the photovoltaic cells;
   liquid in the receivers contacting the heat exchanger extension for transferring heat from the heat exchanger and boiling the liquid into a vapor;
   vapor remover tubes connected to the receivers for removing vapor from the receivers; and
   a liquid supply connected to the receivers for supplying the liquid to the receiver in contact with the heat exchanger, further comprising sensors connected to the receivers and to the liquid supply valves connected to the receivers and the liquid supply and to the sensors for controlling liquid level in the receivers, wherein the sensors are floats in the receivers, wherein the floats are connected to links for opening valves to the receivers, and the valves comprise pilot valves and main liquid supply valves, and the links are connected to the pilot valves.

8. The system of claim 7, wherein the floats in upper positions close first pilot valves and open second pilot valves, wherein springs force main valves closed and wherein the floats in lower positions close the second pilot valves and open the first pilot valves communicating the fluid supply with pistons opposite the main valves, and whereby the pistons overcome the springs forces and open the main valves.

9. The system of claim 1, wherein the Fresnel lenses focus the sun rays beyond the photovoltaic cells.

10. The system of claim 1, wherein the Fresnel lenses focus the sun rays above the photovoltaic cells.

11. The system of claim 10, further comprising a stray light ray recovery system mounted around the photovoltaic cells for reflecting misdirected solar rays from beside the photovoltaic cells back to the photovoltaic cells.

12. A foldable frame system for supporting an array structure, comprising parallel tubes, interconnected by rotatable joints at upper and lower ends, top and bottom links rotatably connected to opposite ends of the parallel tubes for forming top and bottom of the structure pipes when connected to the opposite ones of the parallel tubes for forming angular members between the top and bottom of the structure, whereby the links are aligned with the pipes and the pipes juxtaposed for forming an accordion structure for shaping the structure for shipping, and wherein the pipes are rotated around the tubes and the links are rotated with respect to the tubes for respectively connecting the tops and bottoms of the pipes for forming a rigid three-dimensional structure.

13. The system of claim 12, wherein the sides comprise double inner and outer sides with hinges at first ends of the double sides, and wherein the outer sides are rotated around the hinges and are connected to side pipes when the structure is erected.

14. A solar concentrator system comprising:
a frame having an inverted pyramidal structure, the frame having a top, a base, and sides between the top and the base;
an array of Fresnel lenses arranged on the top for focusing solar rays;
individual inverted conical receivers spaced under the Fresnel lenses for receiving the focused solar rays;
heat concentrators on the receivers for receiving the solar energy focused by the Fresnel lenses;
heat exchanger extensions under the heat concentrators for transferring heat from the heat concentrators;
liquid in the receivers contacting the heat exchanger extension for transferring heat from the heat exchanger extensions and the receivers and boiling the liquid into a steam;
steam remover tubes connected to the receivers for removing steam from the receivers; and
a liquid supply connected to the receivers for supplying the liquid to the receiver in contact with the heat exchanger.

15. The system of claim 14, wherein the heat exchanger extensions further comprise pins or fins extending from the heat exchanger toward a narrow base of the receiver.

16. The system of claim 14, further comprising turbines connected to the tubes and generators connected to the turbines for driving generators with the steam.

17. A two-phase heat exchanging system comprising an array of multiple receiver bodies, liquid in the receiver bodies converted to vapor by heat of solar radiation incident on the receiver bodies, wherein the heat is transferred to the liquid by heat exchanger extensions extending into the receiver body and vapor is removed from the receiver bodies via a vapor-removing tube, which is connected into a network of open piping that makes up structure of the array of receiver bodies, with the vapor being condensed into liquid in the open piping network, which is in contact with the cooler ambient air, the condensed liquid returning under the force of gravity and being redistributed by pump and holding tanks to the multiple receiver bodies in the array through an alternate manifold of piping that feeds the liquid phase back to the receiver bodies.

18. A stowable piping array structure system, comprising plural parallel and diagonal pipes interconnected by rotatable pipe joints in such a manner that interiors of the pipes remain open at the joints, with such piping structure forming rectangular panels, top panels connected to upper pipes in the structure and bottom panels connected to bottom pipes in the structure and arranged in such a manner that the panels alternatively join at tops and bottoms forming pleats into which the top panels and the bottom panels are nested when the structure is accordion folded into a stowed array package.

19. The system of claim 18, wherein at a construction deployment site a first end panel is extended outward away from the stowed array package, exposing alternately a first top panel and a first bottom panel, and wherein the top and bottom panels are hinged and rotate into the top and bottom positions interconnecting alternately adjacent first and second upper pipes and first and second lower pipes, respectively, and the panels are locked into place through the pipe joints which are subsequently tightened and made rigid, the extending continuing with further outward movement of the first end panel and spacing of the second and third upper and lower parallel pipes and rotating and connecting the second top panels and bottom panels rotated into position and linked to each other, thus forming a tetrahedral array structure.

20. The system of claim 19, further comprising first and second end panels connected to outer upper and lower end pipes in the array.

21. The system of claim 20, further comprising first and second side panels hinged at first ends thereof to adjacent ends of the end panels for rotating the side panels around the hinges and fixing second ends of the side panels to second ends of the end panels for completing enclosure of the structure.

* * * * *